US012690236B2

(12) United States Patent
Joo et al.

(10) Patent No.: US 12,690,236 B2
(45) Date of Patent: Jul. 21, 2026

(54) DISPLAY DEVICE

(71) Applicant: Samsung Display Co., Ltd., Yongin-si (KR)

(72) Inventors: Yun Sik Joo, Goyang-si (KR); Seok Je Seong, Seongnam-si (KR); Kyung Hyun Baek, Suwon-si (KR); Hyeon Woo Shin, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 19/009,354

(22) Filed: Jan. 3, 2025

(65) Prior Publication Data

US 2025/0142889 A1     May 1, 2025

Related U.S. Application Data

(63) Continuation of application No. 18/366,896, filed on Aug. 8, 2023, now Pat. No. 12,199,185, which is a (Continued)

(30) Foreign Application Priority Data

Mar. 20, 2020     (KR) ......................... 10-2020-0034543

(51) Int. Cl.
| | |
|---|---|
| *G09G 3/3233* | (2016.01) |
| *G02F 1/1362* | (2006.01) |
| *H10D 30/67* | (2025.01) |

(52) U.S. Cl.
CPC ... *H10D 30/6755* (2025.01); *G02F 1/136286* (2013.01); *G09G 3/3233* (2013.01)

(58) Field of Classification Search
CPC .......... H10D 30/6755; G02F 1/136286; G09G 3/3233
See application file for complete search history.

(56) References Cited

U.S. PATENT DOCUMENTS

| | | | |
|---|---|---|---|
| 9,786,222 | B2 | 10/2017 | Lim et al. |
| 10,991,788 | B2 | 4/2021 | Kwak et al. |

(Continued)

FOREIGN PATENT DOCUMENTS

| | | |
|---|---|---|
| KR | 10-1084169 | 11/2011 |
| KR | 10-2016-0018892 | 2/2016 |

(Continued)

OTHER PUBLICATIONS

Extended European Search Report for European Patent Application or Patent No. 21153087.8 dated Jul. 5, 2021.
(Continued)

*Primary Examiner* — Robert J Michaud
(74) *Attorney, Agent, or Firm* — Sughrue Mion, PLLC

(57) ABSTRACT

A display device includes a first transistor including a gate electrode, a second transistor including a lower gate electrode, an upper gate electrode, and a first end portion electrically connected to an end portion of the first transistor, a lower gate signal line extending in a first direction, an upper gate signal line disposed on the lower gate signal line and extending in a first direction, and a first connection pattern disposed on the upper gate signal line, electrically connecting the gate electrode and a second end portion of the second transistor, and intersecting the lower gate signal line and the upper gate signal line. An entirety of the upper gate signal line overlaps a part of the lower gate signal line in an overlapping area in which the lower gate signal line or the upper gate signal line overlaps the first connection pattern.

30 Claims, 22 Drawing Sheets

Related U.S. Application Data continuation of application No. 17/685,733, filed on Mar. 3, 2022, now Pat. No. 11,769,835, which is a continuation of application No. 17/070,503, filed on Oct. 14, 2020, now Pat. No. 11,296,234.

(56) References Cited

U.S. PATENT DOCUMENTS

| | | | |
|---|---|---|---|
| 11,164,518 B2 | 11/2021 | Na et al. | |
| 2008/0012022 A1 | 1/2008 | Moriwaki | |
| 2018/0069069 A1 | 3/2018 | Ebisuno et al. | |
| 2019/0341440 A1 | 11/2019 | Cha et al. | |
| 2019/0346723 A1 | 11/2019 | Kimura | |
| 2020/0005708 A1 | 1/2020 | Hwang et al. | |
| 2020/0117061 A1* | 4/2020 | Kimura | G02F 1/134309 |
| 2020/0312885 A1* | 10/2020 | Imai | H10D 86/60 |

FOREIGN PATENT DOCUMENTS

| | | |
|---|---|---|
| KR | 10-1686960 | 12/2016 |
| KR | 10-2019-0143806 | 12/2019 |
| KR | 10-2020-0016425 | 2/2020 |

OTHER PUBLICATIONS

Korean Notice of Allowance with English translation for Korean Patent Application or Patent No. 10-2020-0034543, dated Dec. 6, 2024.

* cited by examiner

DISPLAY DEVICE

CROSS-REFERENCE TO RELATED APPLICATION(S)

This is a continuation application of U.S. patent application Ser. No. 18/366,896 filed Aug. 8, 2023 (now pending), the disclosure of which is incorporated herein by reference in its entirety. U.S. patent application Ser. No. 18/366,896 is a continuation application of U.S. patent application Ser. No. 17/685,733 filed Mar. 3, 2022, now U.S. Pat. No. 11,769,835, issued Sep. 26, 2023, the disclosure of which is incorporated herein by reference in its entirety. U.S. patent application Ser. No. 17/685,733 is a continuation application of U.S. patent application Ser. No. 17/070,503 filed Oct. 14, 2020, now U.S. Pat. No. 11,296,234 issued Apr. 5, 2022, the disclosure of which is incorporated herein by reference in its entirety. U.S. patent application Ser. No. 17/070,503 claims priority to and benefit of Korean Patent Application No. 10-2020-0034543 under 35 U.S.C. § 119, filed Mar. 20, 2020 in the Korean Intellectual Property Office (KIPO), the disclosure of which is incorporated herein by reference in its entirety for all purposes.

BACKGROUND

1. Technical Field

Embodiments relate to a display device.

2. Description of the Related Art

A display device is a device displaying an image for providing visual information to a user. The display device may include pixels, and each of the pixels may include a light emitting element generating light and a pixel circuit providing a driving current to the light emitting element. The pixel circuit may include stacked conductive layers.

In the process of forming the conductive layers to form the pixel circuit, the conductive layers may be misaligned due to misalignment of a mask. In this case, capacitances between the conductive layers of pixel rows may not be uniform, therefore, kickback voltages of the pixel rows may not be uniform. Accordingly, stains may be recognized in the display device, and display quality of the display device may be reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device having improved display quality.

A display device according to an embodiment may include a first transistor including a gate electrode disposed on a substrate; a second transistor including a lower gate electrode disposed on the substrate; an upper gate electrode disposed on the lower gate electrode; and a first end portion electrically connected to an end portion of the first transistor; a lower gate signal line extending in a first direction, a portion of the lower gate signal line forming the lower gate electrode; an upper gate signal line disposed on the lower gate signal line and extending in the first direction, a portion of the upper gate signal line forming the upper gate electrode; and a first connection pattern disposed on the upper gate signal line, electrically connecting the gate electrode and a second end portion of the second transistor, and intersecting the lower gate signal line and the upper gate signal line. An entirety of the upper gate signal line may overlap a part of the lower gate signal line in an overlapping area in which the lower gate signal line or the upper gate signal line may overlap the first connection pattern.

In an embodiment, a width of the upper gate signal line in a second direction may be less than a width of the lower gate signal line in the overlapping area in the second direction.

In an embodiment, a difference between the width of the lower gate signal line and the width of the upper gate signal line in the second direction may be greater than about 1 μm.

In an embodiment, the first connection pattern may extend in the overlapping area in the second direction.

In an embodiment, the widths of the first lower gate signal line both inside and outside of the overlapping area in the second direction may be substantially equal, and the widths of the first upper gate signal line both inside and outside of the overlapping area in the second direction may be substantially equal.

In an embodiment, the lower gate signal line may protrude in the second direction in the overlapping area in a plan view.

In an embodiment, the upper gate signal line may be recessed in the second direction in the overlapping area in a plan view.

In an embodiment, the first transistor may include a first active layer disposed between the substrate and the gate electrode; and the second transistor may include a second active layer disposed between the lower gate electrode and the upper gate electrode. A first end portion of the second active layer may be electrically connected to an end portion of the first active layer.

In an embodiment, the first active layer of the first transistor may include polycrystalline silicon, and the second active layer of the second transistor may include an oxide semiconductor.

In an embodiment, the first connection pattern may electrically connect the gate electrode and a second end portion of the second active layer of the second transistor.

In an embodiment, the display device may further include a second connection pattern electrically connecting the end portion of the first active layer and the first end portion of the second active layer, wherein the first connection pattern and the second connection pattern may be disposed on a same layer.

A display device according to an embodiment may include a first transistor including a gate electrode disposed on a substrate; a second transistor including a lower gate electrode disposed on the substrate; an upper gate electrode disposed on the lower gate electrode; and a first end portion electrically connected to an end portion of the first transistor; a lower gate signal line extending in a first direction, a portion of the lower gate signal line forming the lower gate electrode; an upper gate signal line disposed on the lower gate signal line and extending in the first direction, a portion of the upper gate signal line forming the upper gate electrode; and a first connection pattern disposed on the upper gate signal line, electrically connecting the gate electrode and a second end portion of the second transistor, and intersecting the lower gate signal line and the upper gate signal line. An entirety of the lower gate signal line may overlap a part of the upper gate signal line in an overlapping area in which the lower gate signal line or the upper gate signal line may overlap the first connection pattern.

In an embodiment, a width of the upper gate signal line in a second direction may be greater than a width of the lower gate signal line in the overlapping area in the second direction.

In an embodiment, a difference between the width of the upper gate signal line and the width of the lower gate signal line in the second direction may be greater than about 1 μm.

In an embodiment, the first connection pattern may extend in the overlapping area in the second direction.

In an embodiment, the widths of the first lower gate signal line both inside and outside of the overlapping area in the second direction may be substantially equal, and the widths of the first upper gate signal line both inside and outside of the overlapping area in the second direction may be substantially equal.

In an embodiment, the lower gate signal line may be recessed in the second direction in the overlapping area in a plan view.

In an embodiment, the upper gate signal line may protrude in the second direction in the overlapping area in a plan view.

In an embodiment, the first transistor may include a first active layer disposed between the substrate and the gate electrode, and the second transistor may include a second active layer disposed between the lower gate electrode and the upper gate electrode, a first end portion of the second active layer being electrically connected to an end portion of the first active layer.

In an embodiment, the first active layer of the first transistor may include polycrystalline silicon, and the second active layer of the second transistor may include an oxide semiconductor.

In an embodiment, the first connection pattern may electrically connect the gate electrode and a second end portion of the second active layer of the second transistor.

In an embodiment, the display device may further include a second connection pattern electrically connecting the end portion of the first active layer and the first end portion of the second active layer, wherein the first connection pattern and the second connection pattern may be disposed on a same layer.

In the display device according to the embodiments, an entirety of the upper gate signal line may overlap a part of the lower gate signal line, or an entirety of the lower gate signal line may overlap a part of the upper gate signal line in the overlapping area in which the lower gate signal line or the upper gate signal line may overlap the first connection pattern, so that a capacitance between the lower gate signal line and the first connection pattern and a capacitance between the upper gate signal line and the first connection pattern may be constantly maintained. Accordingly, a kickback voltage of the first connection pattern due to a gate signal applied to the lower gate signal line and the upper gate signal line may be constant. Further, stains may not occur in the display device, therefore, display quality of the display device may be improved.

BRIEF DESCRIPTION OF THE DRAWINGS

Illustrative, non-limiting embodiments will be more clearly understood from the following detailed description taken in conjunction with the accompanying drawings in which:

Figure 16:
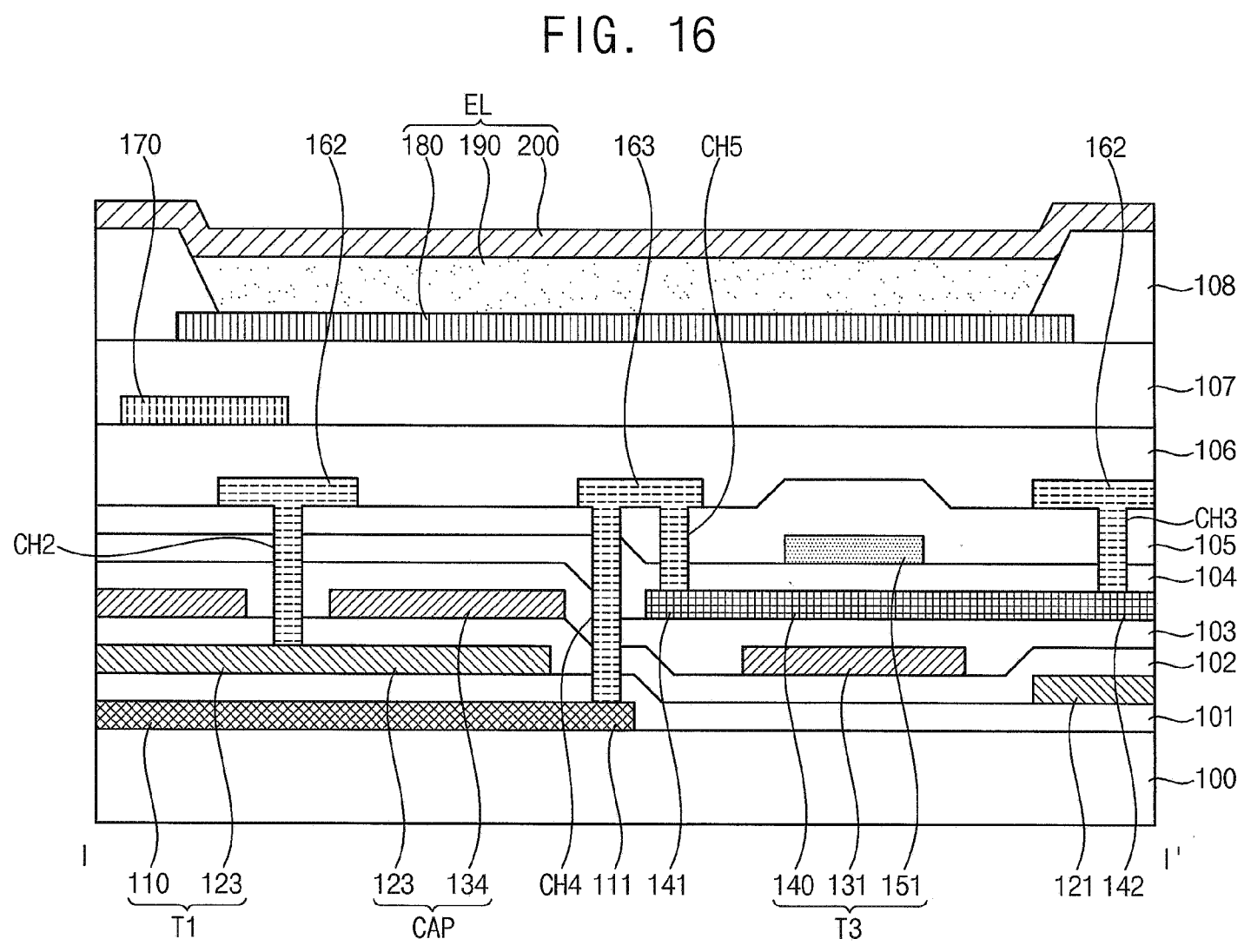

FIG. 16 is a schematic cross-sectional view taken along a line I-I' in FIG. 13.

FIG. 25 is a layout diagram illustrating an example of an area A in FIG. 13.

DETAILED DESCRIPTION OF THE EMBODIMENTS

Figure 1:
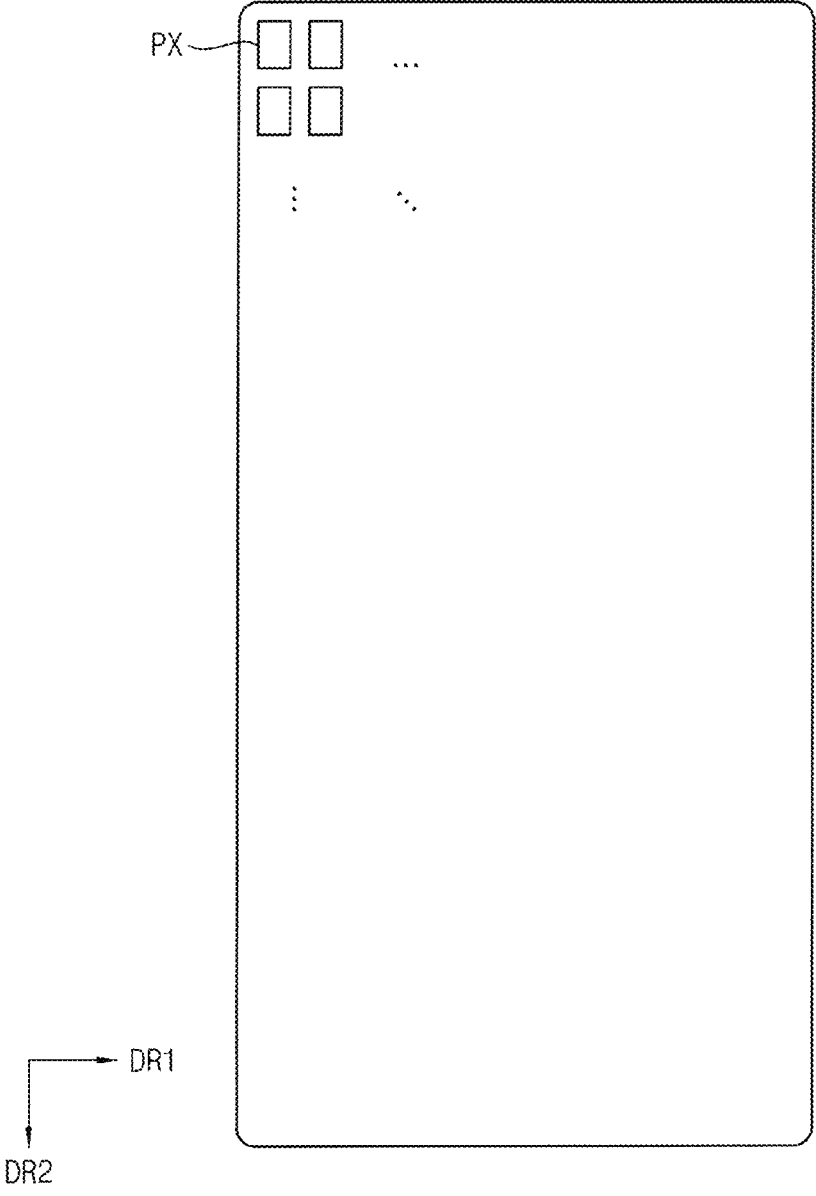
FIG. 1 is a plan view illustrating a display device according to an embodiment.

Hereinafter, display devices in accordance with embodiments will be explained in detail with reference to the accompanying drawings.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a display device according to an embodiment.

Referring to FIG. 1, a display device according to an embodiment may include pixels PX. Each pixel PX may refer to a single area defined by dividing a display area in a plan view for displaying a color, and one pixel PX may display one predetermined basic color. In other words, one pixel PX may be a minimum unit that may display an independent color from another pixel PX. The pixels PX may be arranged or disposed along a first direction DR1 and a second direction DR2 crossing or intersecting the first direction DR1.

Figure 2:
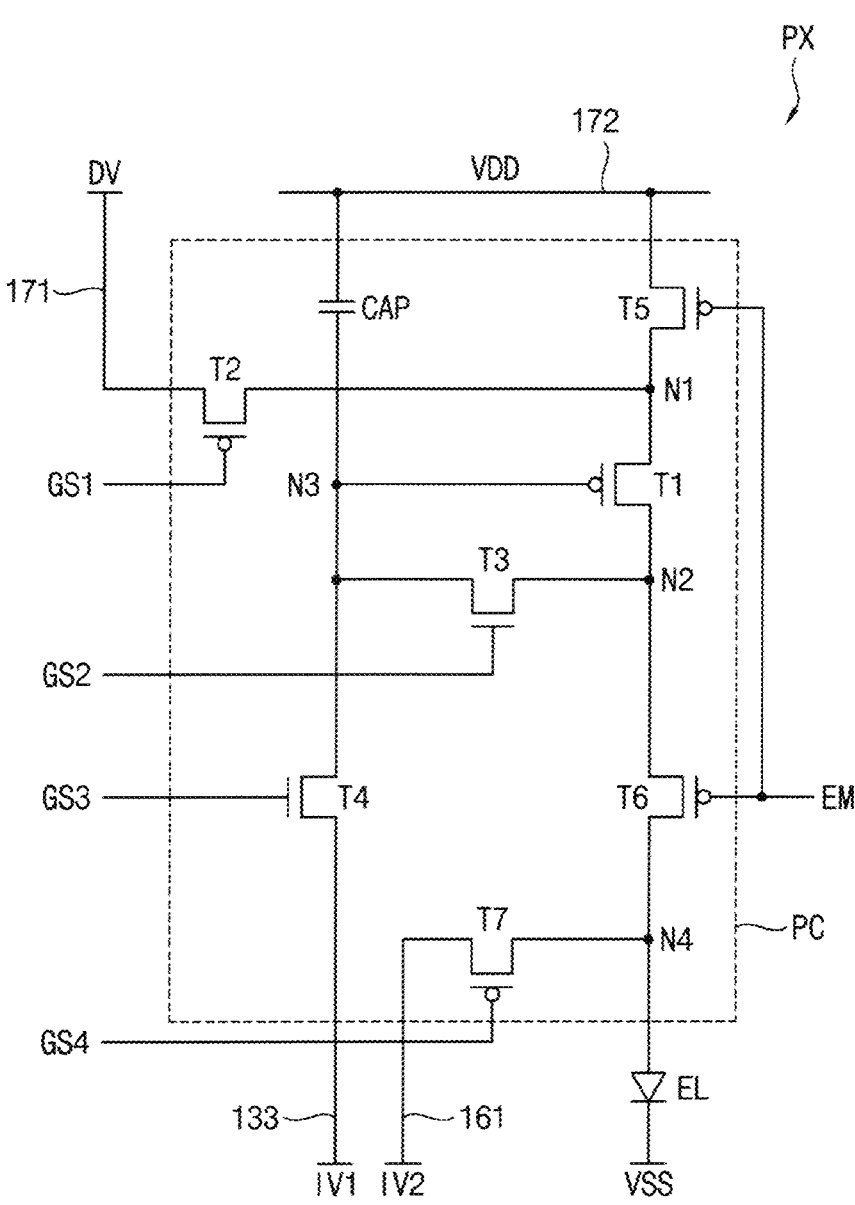
FIG. 2 is an equivalent circuit diagram illustrating a pixel according to an embodiment.
Figure 3:
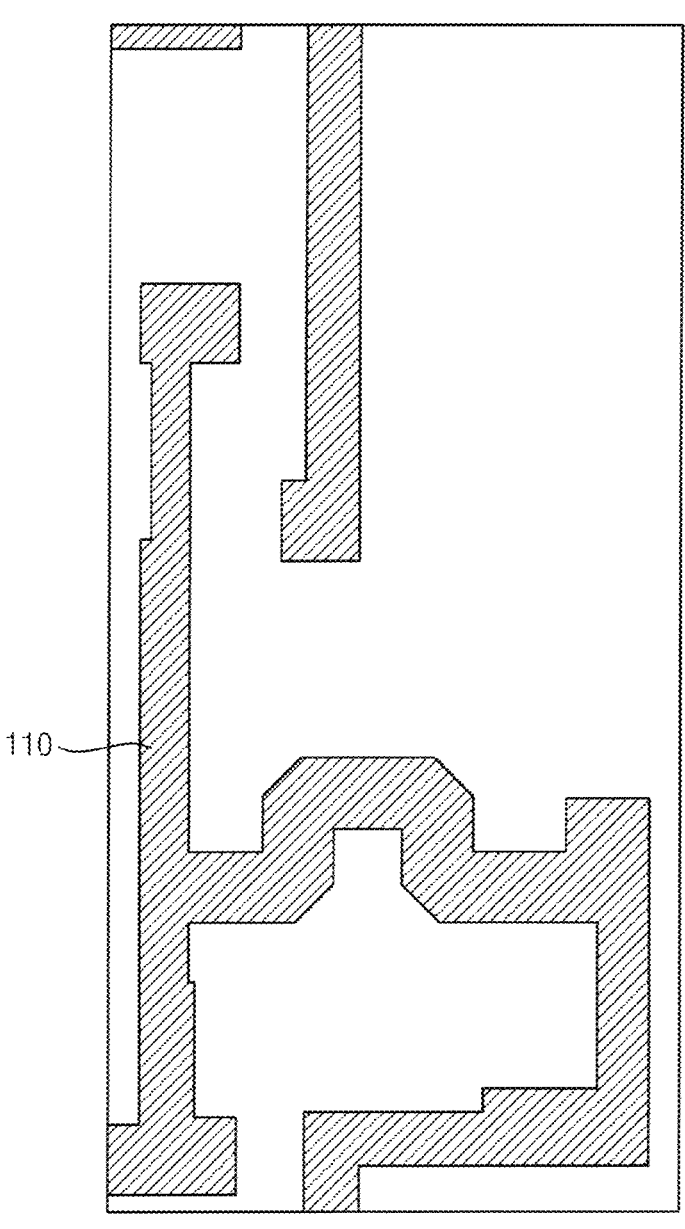
FIGS. 3, 4, 5, 6, 7, 8, 9, 10, 11, 12, 13, 14, and 15 are layout diagrams illustrating an example of the pixel in FIG. 2.
Figure 3:
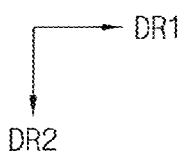
Figure 4:
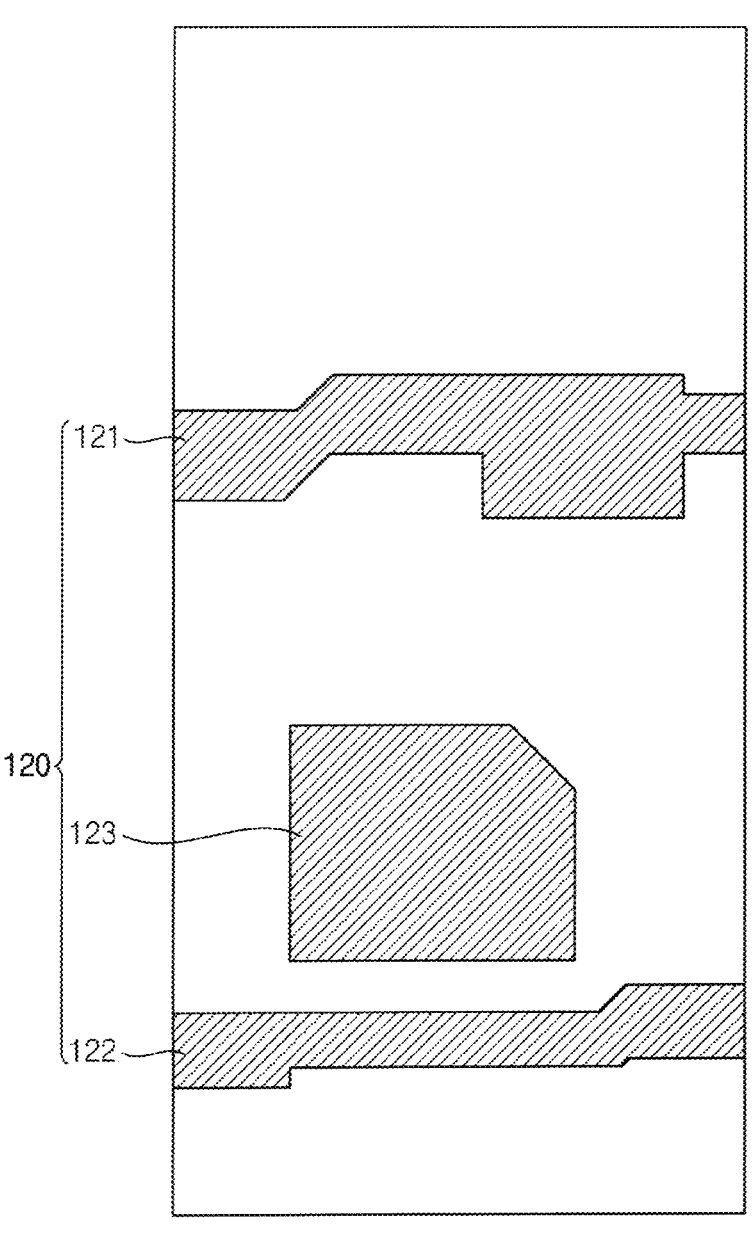
Figure 5:
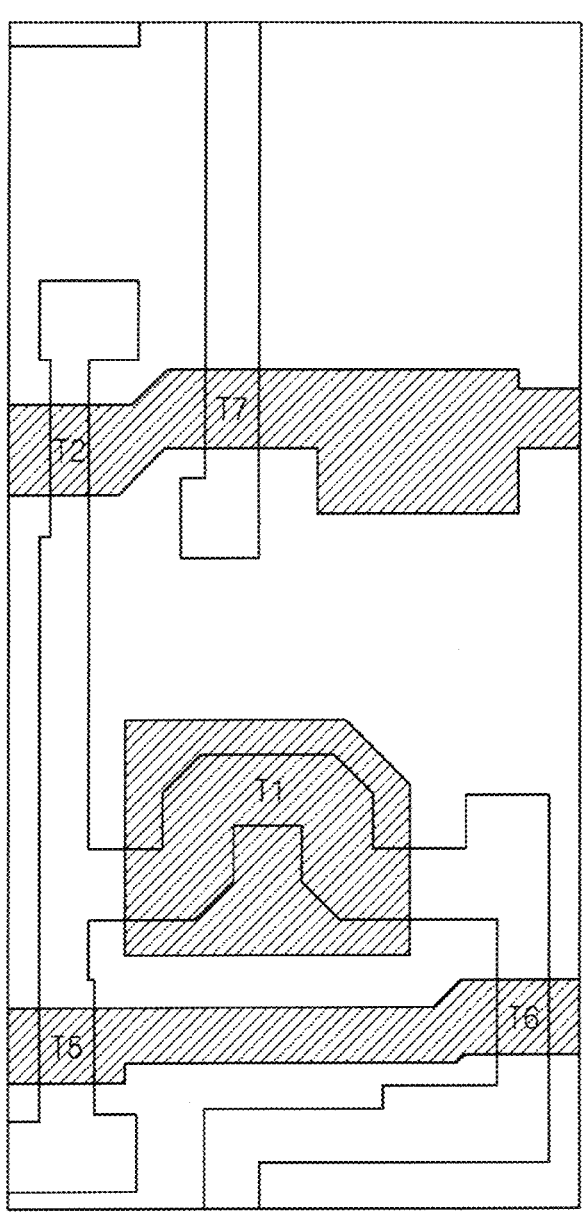
Figure 5:
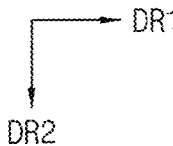
Figure 6:
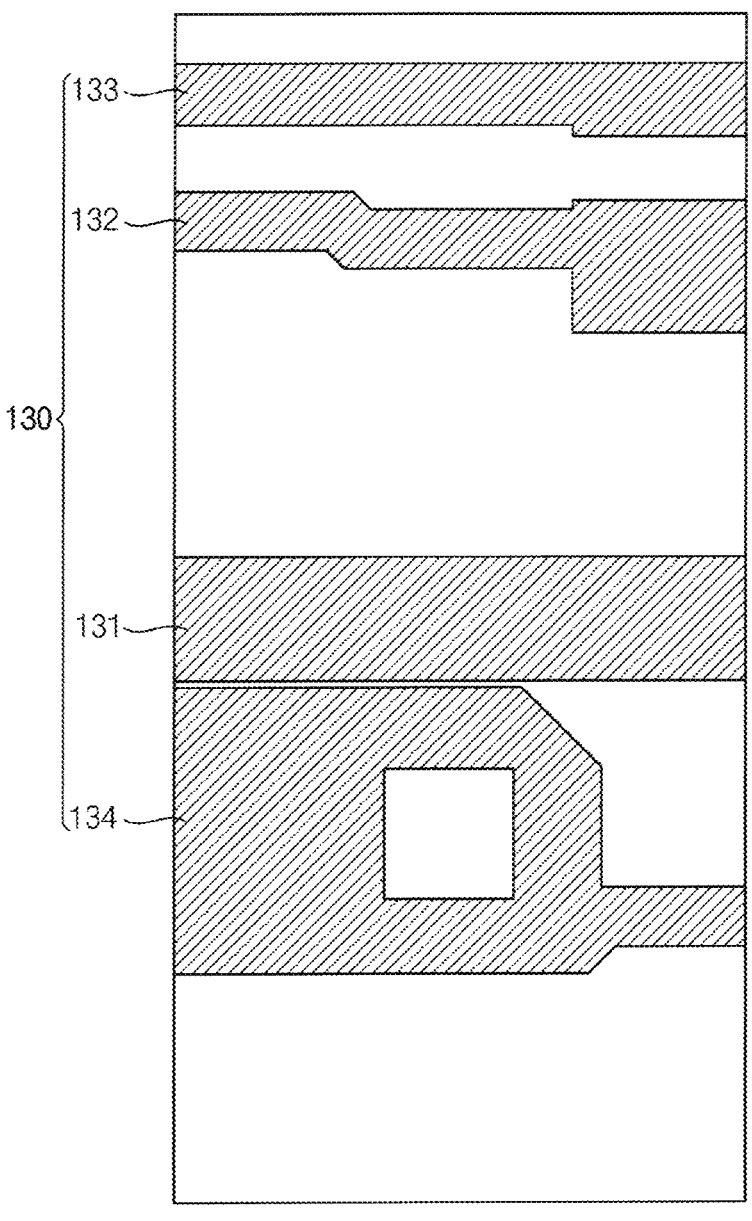
Figure 6:
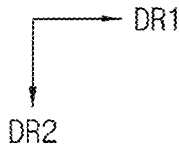
Figure 7:
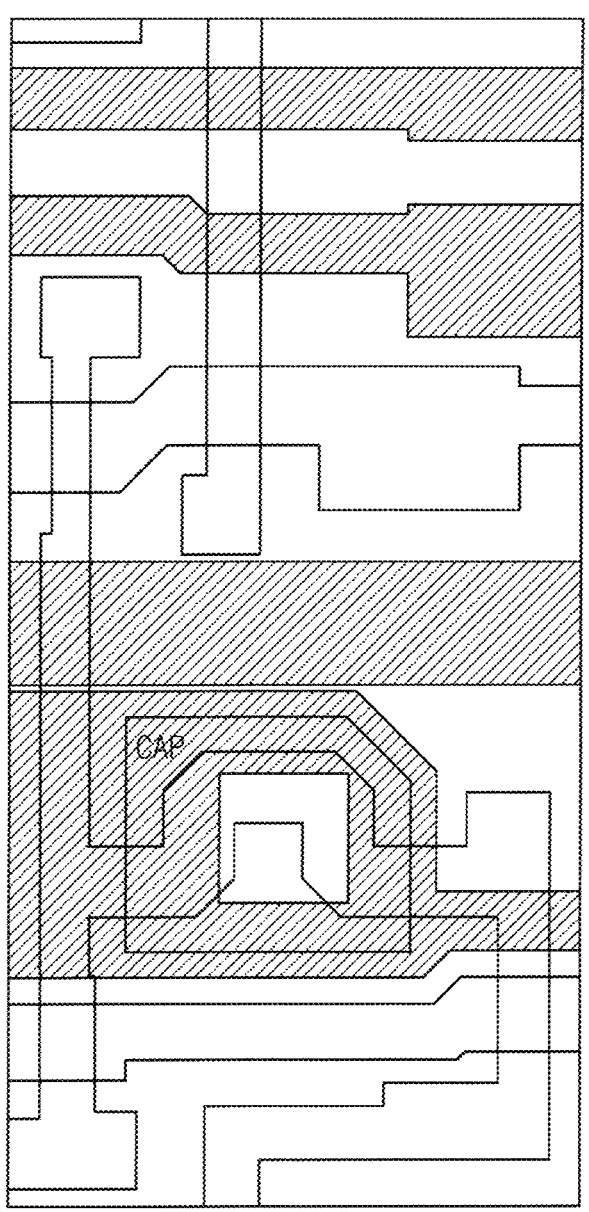
Figure 7:
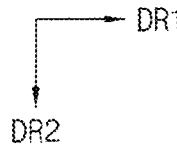
Figure 8:
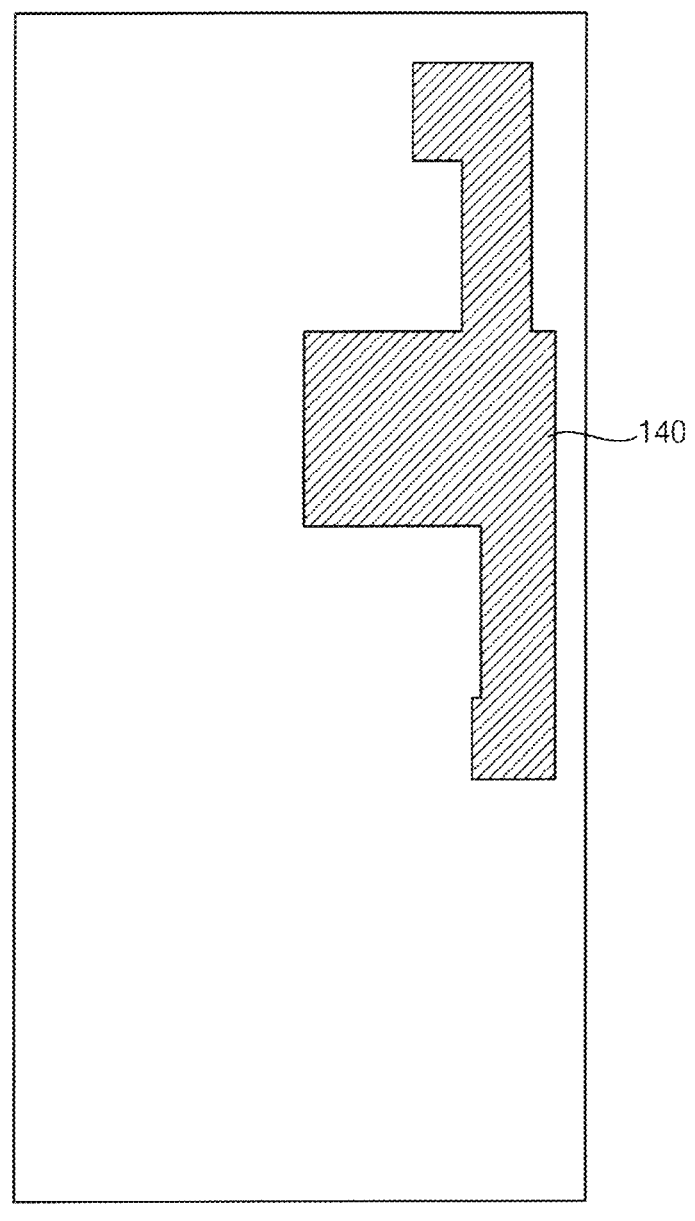
Figure 8:
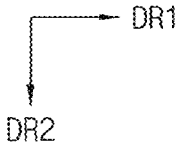
Figure 9:
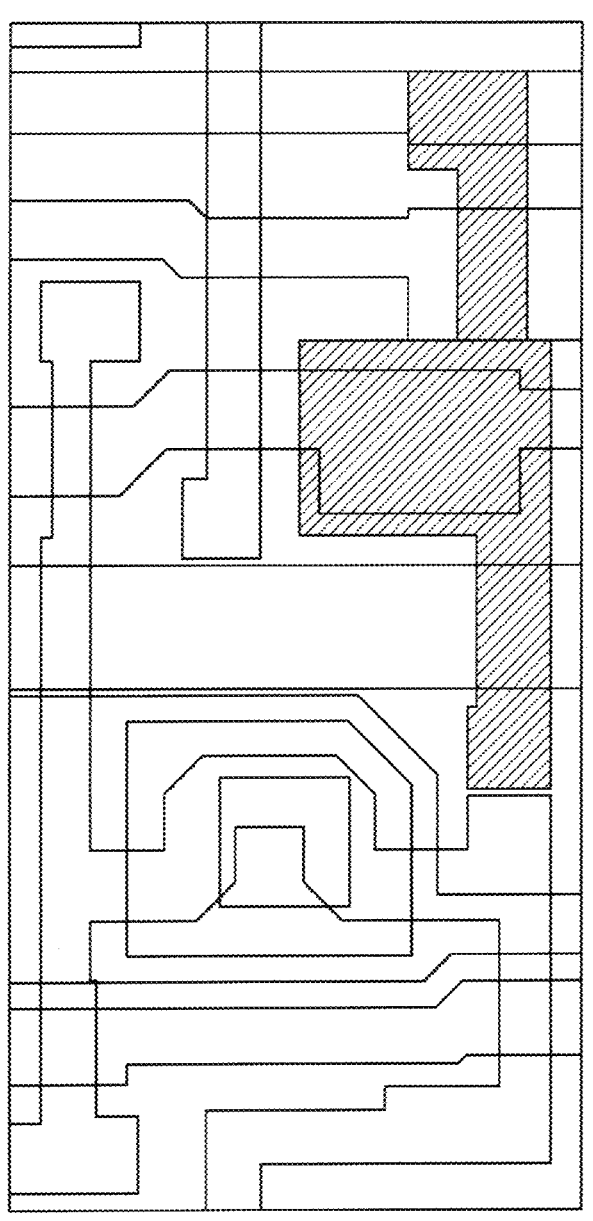
Figure 9:
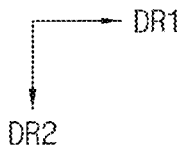
Figure 10:
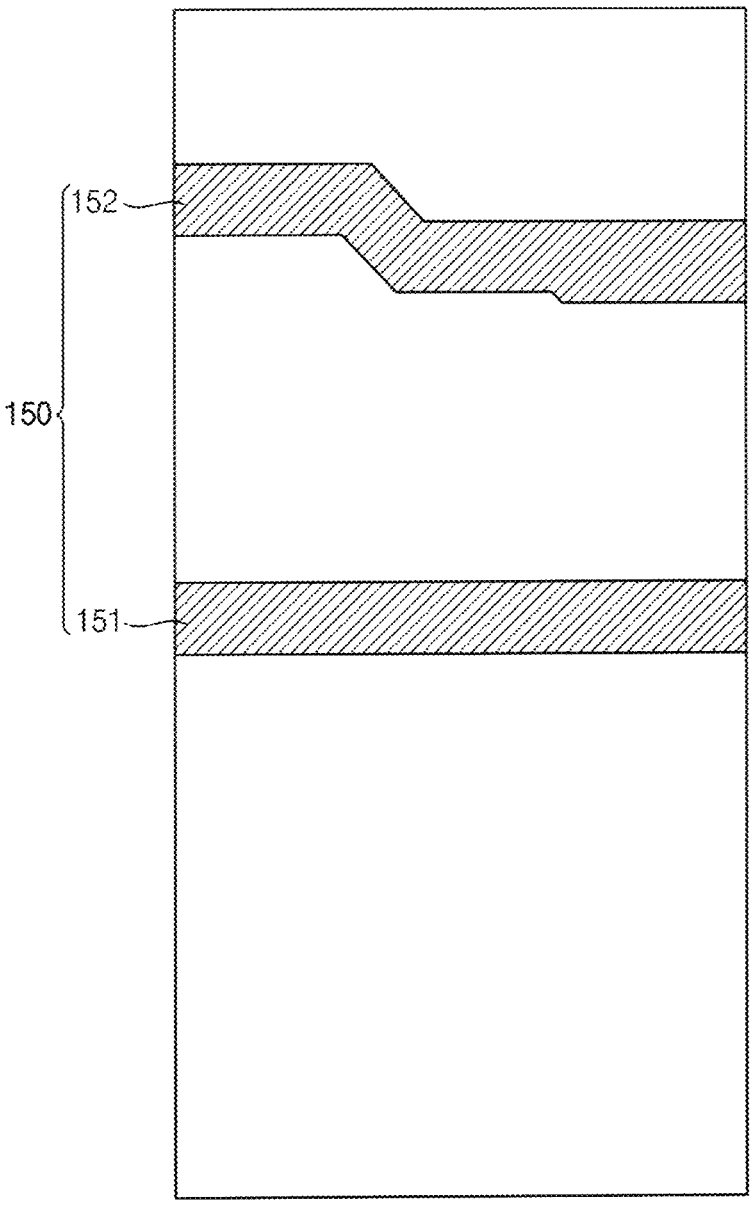
Figure 11:
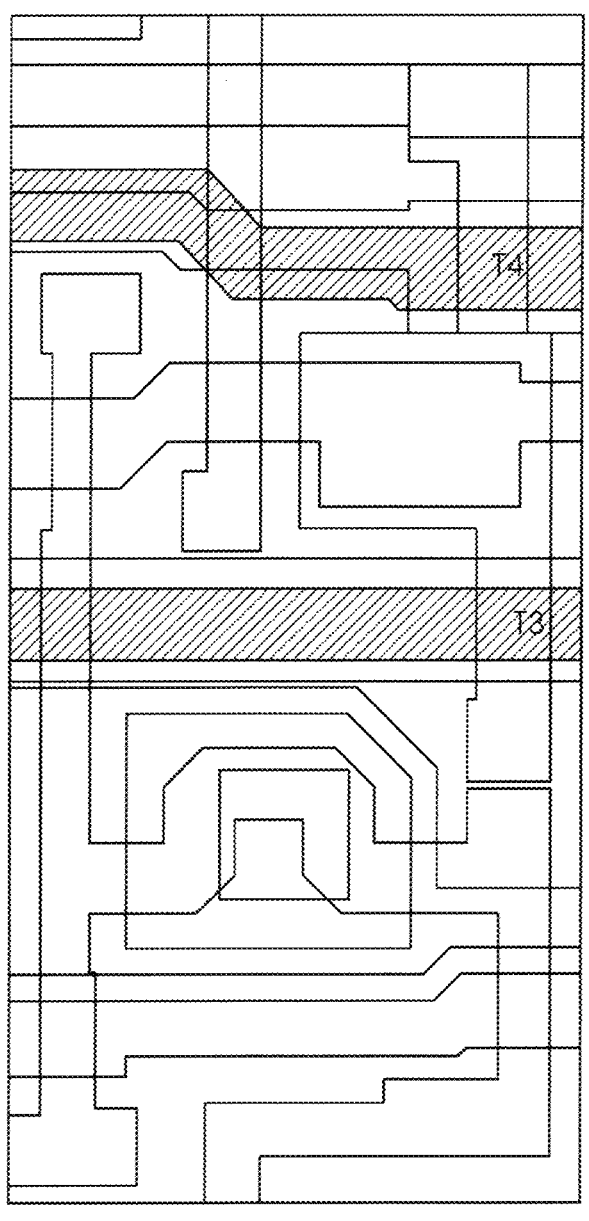
Figure 11:
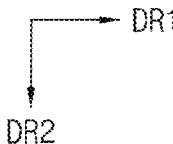
Figure 12:
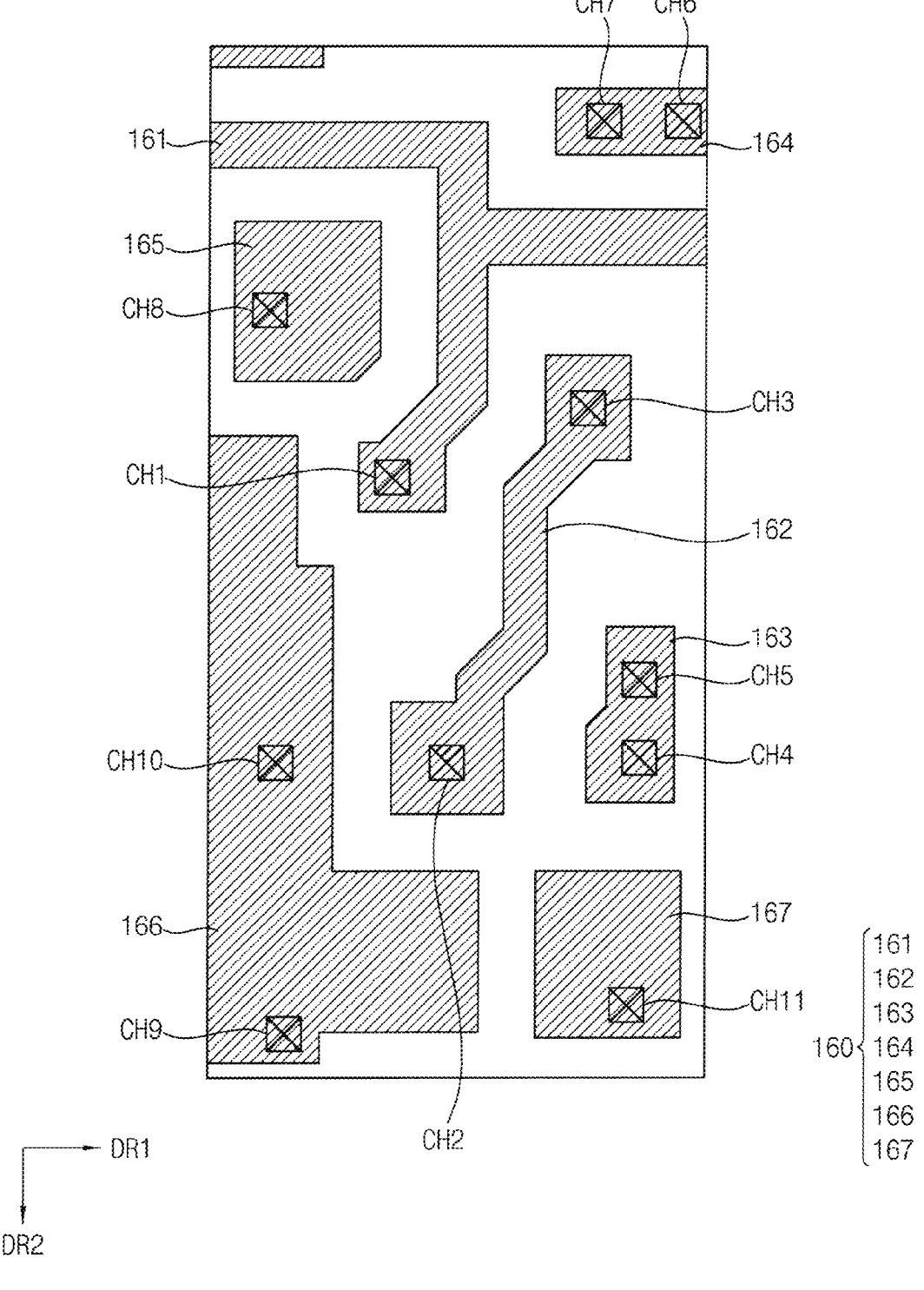

FIG. 2 is an equivalent circuit diagram illustrating a pixel according to an embodiment.

Referring to FIG. 2, a pixel PX according to an embodiment may include a pixel circuit PC and a light emitting element EL. The pixel circuit PC may provide a driving current to the light emitting element EL. The light emitting element EL may emit light based on the driving current provided from the pixel circuit PC. The pixel circuit PC may include at least one transistor and at least one capacitor to generate the driving current.

In an embodiment, the pixel circuit PC may include a first transistor T1, a second transistor T2, a third transistor T3, a fourth transistor T4, a fifth transistor T5, a sixth transistor T6, a seventh transistor T7, and a capacitor CAP. However, the disclosure is not limited thereto, and in an embodiment, the pixel circuit PC may include two to six or eight or more transistors and/or two or more capacitors.

The first transistor T1 may be electrically connected between a first node N1 and a second node N2. A gate electrode of the first transistor T1 may be electrically connected to a third node N3. The first transistor T1 may generate the driving current based on a voltage between the first node N1 and the third node N3.

The second transistor T2 may be electrically connected between a data line 171 and the first node N1. A gate electrode of the second transistor T2 may receive a first gate signal GS1. The second transistor T2 may transmit a data voltage DV to the first node N1 based on the first gate signal GS1.

The third transistor T3 may be electrically connected between the second node N2 and the third node N3. A gate electrode of the third transistor T3 may receive a second gate signal GS2. The third transistor T3 may electrically connect the second node N2 and the third node N3 based on the second gate signal GS2 to compensate a threshold voltage of the first transistor T1.

The fourth transistor T4 may be electrically connected between a first initialization voltage line 133 and the third node N3. A gate electrode of the fourth transistor T4 may receive a third gate signal GS3. In an embodiment, the third gate signal GS3 may be a first gate signal applied to an (N−1)-th pixel row in a case that the pixel PX is included in an N-th pixel row. The fourth transistor T4 may receive a first initialization voltage IV1 from the first initialization voltage line 133, and may transmit the first initialization voltage IV1 to the third node N3 based on the third gate signal GS3 to initialize the gate electrode of the first transistor T1.

The fifth transistor T5 may be electrically connected between a power voltage line 172 and the first node N1. A gate electrode of the fifth transistor T5 may receive an emission control signal EM. The power voltage line 172 may transmit a first power voltage VDD from a first power source.

The sixth transistor T6 may be electrically connected between the second node N2 and a fourth node N4. A gate electrode of the sixth transistor T6 may receive the emission control signal EM. The fifth transistor T5 and the sixth transistor T6 may transmit the driving current generated from the first transistor T1 to the light emitting element EL based on the emission control signal EM.

The seventh transistor T7 may be electrically connected between a second initialization voltage line 161 and the fourth node N4. A gate electrode of the seventh transistor T7 may receive a fourth gate signal GS4. In an embodiment, the fourth gate signal GS4 may be a first gate signal applied to an (N+1)-th pixel row in a case that the pixel PX is included in an N-th pixel row. The seventh transistor T7 may receive a second initialization voltage IV2 from the second initialization voltage line 161, and may transmit the second initialization voltage IV2 to the fourth node N4 based on the fourth gate signal GS4 to initialize the light emitting element EL.

In an embodiment, each of the first transistor T1, the second transistor T2, the fifth transistor T5, the sixth transistor T6, and the seventh transistor T7 may be a transistor having a single gate structure, and each of the third transistor T3 and the fourth transistor T4 may be a transistor having a double gate structure. However, the disclosure is not limited thereto. In such an embodiment, the gate electrode of each of the third transistor T3 and the fourth transistor T4 may include a lower gate electrode and an upper gate electrode, and the lower gate electrode and the upper gate electrode may be electrically connected to each other.

In an embodiment, an active layer of each of the first transistor T1, the second transistor T2, the fifth transistor T5, the sixth transistor T6, and the seventh transistor T7 may be formed of polycrystalline silicon, and an active layer of each of the third transistor T3 and the fourth transistor T4 may be formed of an oxide semiconductor. In an embodiment, each of the first transistor T1, the second transistor T2, the fifth transistor T5, the sixth transistor T6, and the seventh transistor T7 may be a PMOS, and each of the third transistor T3 and the fourth transistor T4 may be an NMOS. However, the disclosure is not limited thereto.

The capacitor CAP may be electrically connected between the power voltage line 172 and the third node N3. The capacitor CAP may maintain the voltage between the first node N1 and the third node N3 in a case that the second transistor T2 is turned off, so that the light emitting element EL may emit light.

The light emitting element EL may be electrically connected between the fourth node N4 and a second power source. The second power source may provide a second power voltage VSS. In an embodiment, the second power voltage VSS may be less than the first power voltage VDD. The light emitting element EL may emit light based on the driving current transmitted from the pixel circuit PC.

FIGS. 3, 4, 5, 6, 7, 8, 9, 10, 11, 12, 13, 14, and 15 are layout diagrams illustrating an example of the pixel PX in FIG. 2. FIG. 16 is a schematic cross-sectional view taken along a line I-I' in FIG. 13.

Referring to FIGS. 2 to 16, the pixel PX may include a first active layer 110, a first conductive layer 120, a second conductive layer 130, a second active layer 140, a third conductive layer 150, a fourth conductive layer 160, a fifth conductive layer 170, a first electrode 180, an emission layer 190, and a second electrode 200 which may be disposed on a substrate 100.

The substrate 100 may be an insulating substrate including glass, quartz, plastic, or the like within the spirit and the scope of the disclosure. In an embodiment, the substrate 100 may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulation material such as polyimide (PI) or the like within the spirit and the scope of the disclosure. The first barrier layer and the second barrier layer may include an inorganic insulation material such as silicon oxide, silicon nitride, amorphous silicon, or the like within the spirit and the scope of the disclosure.

The first active layer 110 may be disposed on the substrate 100. In an embodiment, the first active layer 110 may include polycrystalline silicon. However, the disclosure is not limited thereto, and in an embodiment, the first active layer 110 may include amorphous silicon, an oxide semiconductor, or the like within the spirit and the scope of the disclosure.

A buffer layer may be disposed between the substrate 100 and the first active layer 110. The buffer layer may block impurities from being permeated toward above the substrate 100 through the substrate 100. The buffer layer may provide a planarized upper surface above the substrate 100. The buffer layer may include an inorganic insulation material such as silicon oxide, silicon nitride, silicon oxynitride, or the like within the spirit and the scope of the disclosure. The buffer layer may be omitted.

The first conductive layer 120 may be disposed on the first active layer 110. The first conductive layer 120 may include a conductive material such as molybdenum (Mo), copper (Cu), or the like within the spirit and the scope of the disclosure.

A first insulation layer 101 may be disposed between the first active layer 110 and the first conductive layer 120. The first insulation layer 101 may include an inorganic insulation material such as silicon oxide, silicon nitride, silicon oxynitride, or the like within the spirit and the scope of the disclosure.

The first conductive layer 120 may include a first gate signal line 121, an emission control signal line 122, and a conductive pattern 123. The first gate signal line 121 may extend in the first direction DR1. The emission control signal line 122 may be spaced apart from the first gate signal line 121, and may extend in the first direction DR1. The conductive pattern 123 may be positioned or disposed between the first gate signal line 121 and the emission control signal line 122.

A first portion of the first gate signal line 121 overlapping the first active layer 110 may form the gate electrode of the second transistor T2, and a second portion of the first gate signal line 121 overlapping the first active layer 110 may form the gate electrode of the seventh transistor T7. A portion of the first active layer 110 overlapping the gate electrode of the second transistor T2 may be a channel region of the second transistor T2, and a portion of the first active layer 110 overlapping the gate electrode of the seventh transistor T7 may be a channel region of the seventh transistor T7. Accordingly, the first active layer 110 and the first portion of the first gate signal line 121 may form the second transistor T2, and the first active layer 110 and the second portion of the first gate signal line 121 may form the seventh transistor T7.

A first portion of the emission control signal line 122 overlapping the first active layer 110 may form the gate electrode of the fifth transistor T5, and a second portion of the emission control signal line 122 overlapping the first active layer 110 may form the gate electrode of the sixth transistor T6. A portion of the first active layer 110 overlapping the gate electrode of the fifth transistor T5 may be a channel region of the fifth transistor T5, and a portion of the first active layer 110 overlapping the gate electrode of the sixth transistor T6 may be a channel region of the sixth transistor T6. Accordingly, the first active layer 110 and the first portion of the emission control signal line 122 may form the fifth transistor T5, and the first active layer 110 and the second portion of the emission control signal line 122 may form the sixth transistor T6.

A portion of the conductive pattern 123 overlapping the first active layer 110 may form the gate electrode of the first transistor T1. A portion of the first active layer 110 overlapping the gate electrode of the first transistor T1 may be a channel region of the first transistor T1. Accordingly, the first active layer 110 and the portion of the conductive pattern 123 may form the first transistor T1.

The second conductive layer 130 may be disposed on the first conductive layer 120. The second conductive layer 130 may include a conductive material such as molybdenum (Mo), copper (Cu), or the like within the spirit and the scope of the disclosure.

A second insulation layer 102 may be disposed between the first conductive layer 120 and the second conductive layer 130. The second insulation layer 102 may include an inorganic insulation material such as silicon oxide, silicon nitride, silicon oxynitride, or the like within the spirit and the scope of the disclosure.

The second conductive layer 130 may include a first lower gate signal line 131, a second lower gate signal line 132, the first initialization voltage line 133, and a conductive line 134. The first lower gate signal line 131 may extend in the first direction DR1. The second lower gate signal line 132 may be spaced apart from the first lower gate signal line 131, and may extend in the first direction DR1. The first initialization voltage line 133 may be spaced apart from the second lower gate signal line 132, and may extend in the first direction DR1. The conductive line 134 may be spaced apart from the first lower gate signal line 131, and may extend in the first direction DR1.

The conductive line 134 may overlap the conductive pattern 123. The conductive pattern 123 and the conductive line 134 may form the capacitor CAP.

The second active layer 140 may be disposed on the second conductive layer 130. The second active layer 140 may not overlap the first active layer 110. In an embodiment, the second active layer 140 may include an oxide semiconductor. However, the disclosure is not limited thereto, and in an embodiment, the second active layer 140 may include amorphous silicon, polycrystalline silicon, or the like within the spirit and the scope of the disclosure.

A third insulation layer 103 may be disposed between the second conductive layer 130 and the second active layer 140. The third insulation layer 103 may include an inorganic insulation material such as silicon oxide, silicon nitride, silicon oxynitride, or the like within the spirit and the scope of the disclosure.

The third conductive layer 150 may be disposed on the second active layer 140. The third conductive layer 150 may include a conductive material such as molybdenum (Mo), copper (Cu), or the like within the spirit and the scope of the disclosure.

A fourth insulation layer 104 may be disposed between the second active layer 140 and the third conductive layer 150. The fourth insulation layer 104 may include an inorganic insulation material such as silicon oxide, silicon nitride, silicon oxynitride, or the like within the spirit and the scope of the disclosure.

The third conductive layer 150 may include a first upper gate signal line 151 and a second upper gate signal line 152. The first upper gate signal line 151 may extend in the first direction DR1. The second upper gate signal line 152 may be spaced apart from the first upper gate signal line 151, and may extend in the first direction DR1.

A portion of the first lower gate signal line 131 overlapping the second active layer 140 may form the lower gate electrode of the third transistor T3, and a portion of the first upper gate signal line 151 overlapping the second active layer 140 may form the upper gate electrode of the third transistor T3. A portion of the second active layer 140 overlapping the lower gate electrode and the upper gate electrode of the third transistor T3 may be a channel region of the third transistor T3. Accordingly, the portion of the first lower gate signal line 131, the second active layer 140, and the portion of the first upper gate signal line 151 may form the third transistor T3. The third transistor T3 may be a transistor having a double gate structure.

A portion of the second lower gate signal line 132 overlapping the second active layer 140 may form the lower gate electrode of the fourth transistor T4, and a portion of the second upper gate signal line 152 overlapping the second active layer 140 may form the upper gate electrode of the fourth transistor T4. A portion of the second active layer 140 overlapping the lower gate electrode and the upper gate electrode of the fourth transistor T4 may be a channel region of the fourth transistor T4. Accordingly, the portion of the second lower gate signal line 132, the second active layer 140, and the portion of the second upper gate signal line 152 may form the fourth transistor T4. The fourth transistor T4 may be a transistor having a double gate structure.

The fourth conductive layer 160 may be disposed on the third conductive layer 150. The fourth conductive layer 160 may include a conductive material such as aluminum (Al), titanium (Ti), copper (Cu), or the like within the spirit and the scope of the disclosure. In an embodiment, the fourth conductive layer 160 may have a multilayer structure including a Ti layer, an Al layer, and a Ti layer which may be stacked.

A fifth insulation layer 105 may be disposed between the third conductive layer 150 and the fourth conductive layer 160. The fifth insulation layer 105 may include an inorganic insulation material such as silicon oxide, silicon nitride, silicon oxynitride, or the like and/or an organic insulation material such as polyimide (PI) or the like within the spirit and the scope of the disclosure.

The fourth conductive layer 160 may include the second initialization voltage line 161, a first connection pattern 162, a second connection pattern 163, a third connection pattern 164, a first contact pattern 165, a second contact pattern 166, and a third contact pattern 167. The second initialization voltage line 161 may extend in the first direction DR1. The second initialization voltage line 161 may be electrically connected to the first active layer 110 through a first contact hole CH1. Accordingly, the second initialization voltage line 161 may be electrically connected to the seventh transistor T7.

The first connection pattern 162 may be spaced apart from the second initialization voltage line 161. The first connection pattern 162 may be electrically connected to the conductive pattern 123 through a second contact hole CH2, and may be electrically connected to the second active layer 140 through a third contact hole CH3. Accordingly, the first connection pattern 162 may electrically connect the gate electrode of the first transistor T1 and a second end portion of the third transistor T3. For example, the first connection pattern 162 may electrically connect the gate electrode of the first transistor T1 and a second end portion 142 of the second active layer 140.

The second connection pattern 163 may be spaced apart from the first connection pattern 162. The second connection pattern 163 may be electrically connected to the first active layer 110 through a fourth contact hole CH4, and may be electrically connected to the second active layer 140 through a fifth contact hole CH5. Accordingly, the second connection pattern 163 may electrically connect an end portion of the first transistor T1 and a first end portion of the third transistor T3. As an example, the second connection pattern 163 may electrically connect an end portion 111 of the first active layer 110 and a first end portion 141 of the second active layer 140.

The third connection pattern 164 may be spaced apart from the second connection pattern 163. The third connection pattern 164 may be electrically connected to the first initialization voltage line 133 through a sixth contact hole CH6, and may be electrically connected to the second active layer 140 through a seventh contact hole CH7. Accordingly, the third connection pattern 164 may electrically connect the first initialization voltage line 133 and the second active layer 140. The first initialization voltage line 133 may be electrically connected to the fourth transistor T4 through the third connection pattern 164.

The first contact pattern 165 may be spaced apart from the third connection pattern 164. The first contact pattern 165 may be electrically connected to the first active layer 110 through an eighth contact hole CH8. Accordingly, the first contact pattern 165 may be electrically connected to the second transistor T2.

The second contact pattern 166 may be spaced apart from the first contact pattern 165. The second contact pattern 166 may be electrically connected to the first active layer 110 through a ninth contact hole CH9, and may be electrically connected to the conductive line 134 through a tenth contact hole CH10. Accordingly, the second contact pattern 166 may be electrically connected to the fifth transistor T5 and the capacitor CAP.

The third contact pattern 167 may be spaced apart from the second contact pattern 166. The third contact pattern 167 may be electrically connected to the first active layer 110 through an eleventh contact hole CH11. Accordingly, the third contact pattern 167 may be electrically connected to the sixth transistor T6.

The fifth conductive layer 170 may be disposed on the fourth conductive layer 160. The fifth conductive layer 170 may include a conductive material such as aluminum (Al), titanium (Ti), copper (Cu), or the like within the spirit and the scope of the disclosure. In an embodiment, the fifth conductive layer 170 may have a multilayer structure including a Ti layer, an Al layer, and a Ti layer which may be stacked.

A sixth insulation layer 106 may be disposed between the fourth conductive layer 160 and the fifth conductive layer 170. The sixth insulation layer 106 may include an inorganic insulation material such as silicon oxide, silicon nitride, silicon oxynitride, or the like and/or an organic insulation material such as polyimide (PI) or the like within the spirit and the scope of the disclosure.

The fifth conductive layer 170 may include the data line 171, the power voltage line 172, and a fourth contact pattern 173. The data line 171 may extend in the second direction DR2. The date line 171 may be electrically connected to the first contact pattern 165 through a twelfth contact hole CH12. Accordingly, the date line 171 may be electrically connected to the second transistor T2 through the first contact pattern 165.

The power voltage line 172 may be spaced apart from the date line 171, and may extend in the second direction DR2. The power voltage line 172 may be electrically connected to the second contact pattern 162 through a thirteenth contact hole CH13. Accordingly, the power voltage line 172 may be electrically connected to the fifth transistor T5 and the capacitor CAP through the second contact pattern 166.

The fourth contact pattern 173 may be spaced apart from the power voltage line 172. The fourth contact pattern 173 may be electrically connected to the third contact pattern 167 through a fourteenth contact hole CH14.

The first electrode 180 may be disposed on the fifth conductive layer 170. The first electrode 180 may include a conductive material such as a metal, an alloy, a transparent conductive oxide, or the like within the spirit and the scope of the disclosure. For example, the first electrode 180 may include silver (Ag), indium tin oxide (ITO), or the like within the spirit and the scope of the disclosure. In an embodiment, the first electrode 180 may have a multilayer structure including an ITO layer, an Ag layer, and an ITO layer which may be stacked.

A seventh insulation layer 107 may be disposed between the fifth conductive layer 170 and the first electrode 180. The seventh insulation layer 107 may include an inorganic insulation material such as silicon oxide, silicon nitride, silicon oxynitride, or the like and/or an organic insulation material such as polyimide (PI) or the like within the spirit and the scope of the disclosure.

The first electrode 180 may be electrically connected to the fourth contact pattern 173 through a contact hole. Accordingly, the first electrode 180 may be electrically connected to the sixth transistor T6 through the third contact pattern 167 and the fourth contact pattern 173.

An eighth insulation layer 108 may be disposed on the first electrode 180. The eighth insulation layer 108 may cover or overlap the first electrode 180, and may be disposed on the seventh insulation layer 107. The eighth insulation layer 108 may have a pixel opening exposing at least a portion of the first electrode 180. In an embodiment, the pixel opening may expose a central portion of the first electrode 180, and the eighth insulation layer 108 may cover or overlap a peripheral portion of the first electrode 180. The eighth insulation layer 108 may include an organic insulation material such as polyimide (PI) or the like within the spirit and the scope of the disclosure.

The emission layer 190 may be disposed on the first electrode 180. The emission layer 190 may be disposed on the first electrode 180 exposed by the pixel opening. The emission layer 190 may include at least one of an organic light emitting material and a quantum dot.

In an embodiment, the organic light emitting material may include a low molecular organic compound or a high molecular organic compound. For example, the low molecular organic compound may include copper phthalocyanine, diphenylbenzidine (N, N'-diphenylbenzidine), trihydroxyquinoline aluminum (tris-(8-hydroxyquinoline)aluminum), and the like within the spirit and the scope of the disclosure. The high molecular organic compound may include poly ethylenedioxythiophene (poly(3,4-ethylenedioxythiophene), polyaniline, polyphenylenevinylene, polyfluorene, and the like within the spirit and the scope of the disclosure.

In an embodiment, the quantum dot may include a core including a group II-VI compound, a group III-V compound, a group IV-VI compound, a group IV element, a group IV compound, and a combination thereof. In an embodiment, the quantum dot may have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second electrode 200 may be disposed on the emission layer 190. In an embodiment, the second electrode 200 may also be disposed on the eighth insulation layer 108. The second electrode 200 may include a conductive material such as a metal, an alloy, a transparent conductive oxide, or the like within the spirit and the scope of the disclosure. For example, the second electrode 200 may include aluminum (Al), platinum (Pt), silver (Ag), magnesium (Mg), gold (Au), chromium (Cr), tungsten (W), titanium (Ti), or the like within the spirit and the scope of the disclosure. The first electrode 180, the emission layer 190, and the second electrode 200 may form the light emitting element EL.

Figure 13:
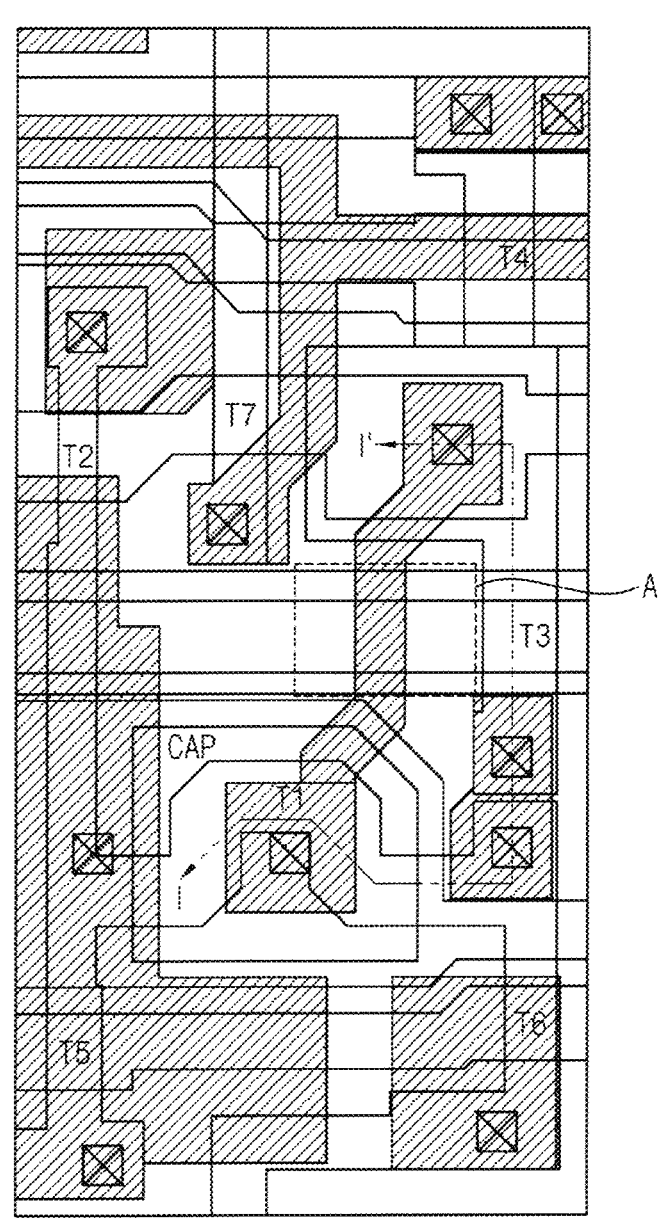
Figure 13:
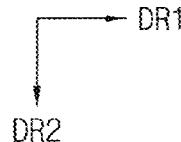
Figure 14:
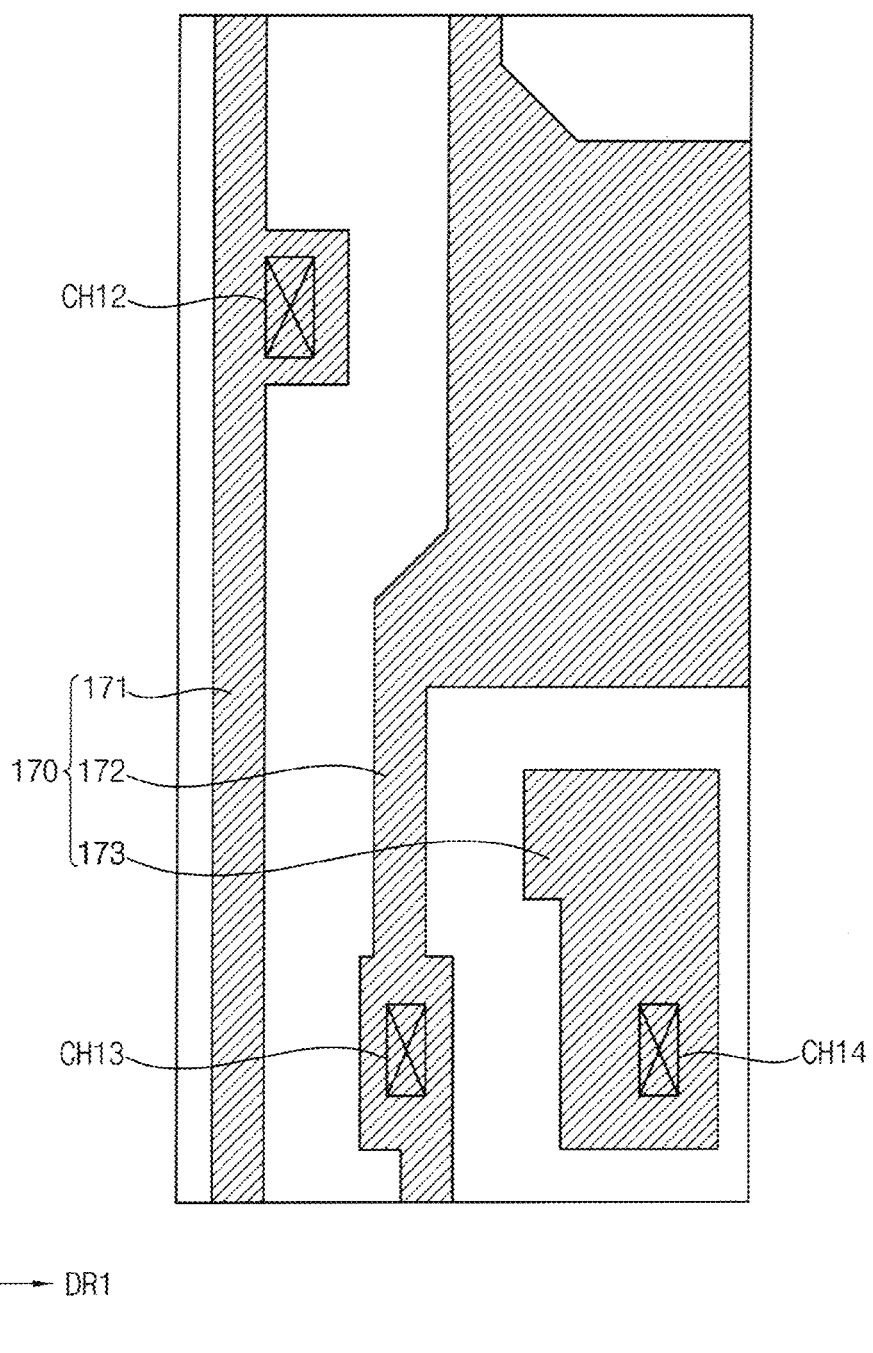
Figure 15:
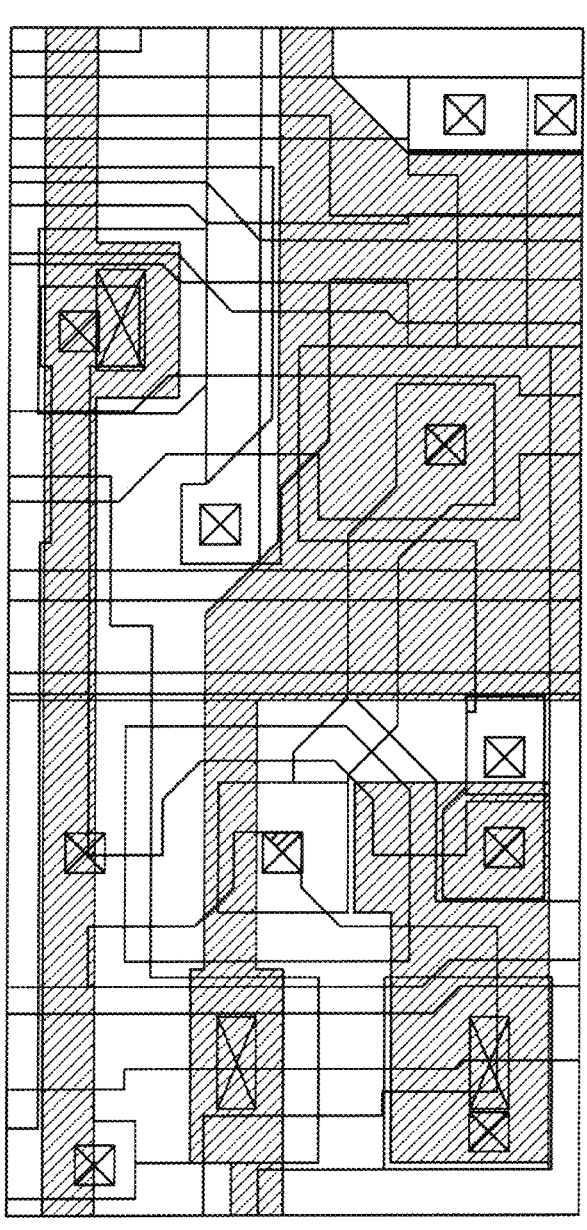
Figure 15:
Figure 17:
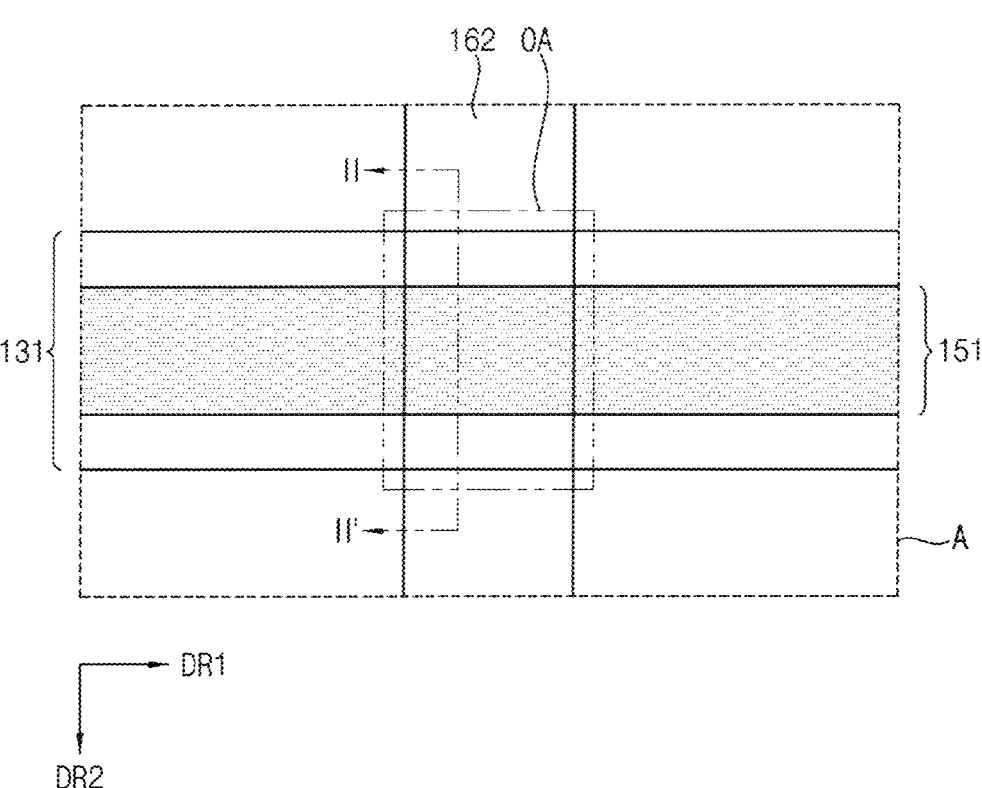
FIG. 17 is a layout diagram illustrating an example of an area A in FIG. 13.
Figure 18:
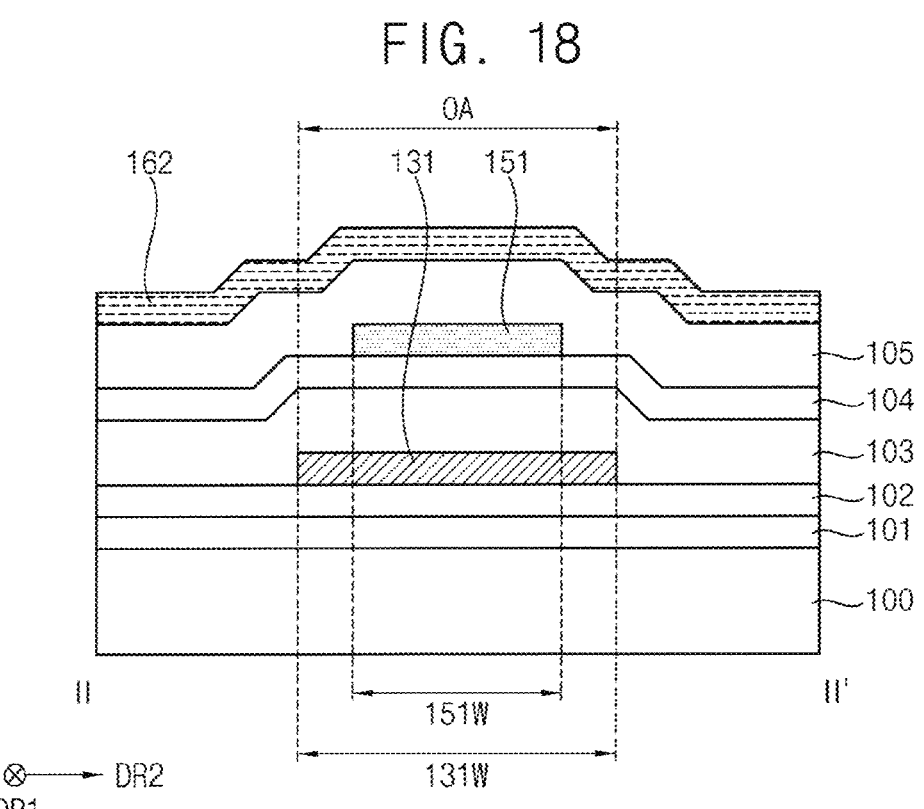
FIG. 18 is a schematic cross-sectional view taken along a line II-II' in FIG. 17.

FIG. 17 is a layout diagram illustrating an example of an area A in FIG. 13. FIG. 18 is a schematic cross-sectional view taken along a line II-II' in FIG. 17.

Referring to FIGS. 17 and 18, the first upper gate signal line 151 may be disposed on the first lower gate signal line 131, and the first connection pattern 162 may be disposed on the first upper gate signal line 151. The first connection pattern 162 may cross or intersect the first lower gate signal line 131 and the first upper gate signal line 151 which may extend in the first direction DR1. An area in which the first lower gate signal line 131 or the first upper gate signal line 151 may overlap the first connection pattern 162 may be defined as an overlapping area OA. The first connection pattern 162 may extend in the second direction DR2 in the overlapping area OA.

A width 151W of the first upper gate signal line 151 in the second direction DR2 may be less than a width 131W of the first lower gate signal line 131 in the second direction DR2 in the overlapping area OA. An entirety of the first upper gate signal line 151 may overlap a part of the first lower gate signal line 131 in the overlapping area OA. In other words, a portion of the first lower gate signal line 131 may overlap the first upper gate signal line 151 in the overlapping area OA, and another portion of the first lower gate signal line 131 may not overlap the first upper gate signal line 151 in the overlapping area OA. For example, a central portion of the first lower gate signal line 131 in the second direction DR2 may overlap the first upper gate signal line 151 in the overlapping area OA, and side portions of the first lower gate signal line 131 in the second direction DR2 may not overlap the first upper gate signal line 151 in the overlapping area OA.

In a comparative example, in a case that a first lower gate signal line and a first upper gate signal line partially overlap each other in an overlapping area, due to tolerance in the process of forming the first upper gate signal line on the first lower gate signal line, a capacitance between the first lower gate signal line and the first upper gate signal line may be changed. However, in an embodiment, the width 151W of the first upper gate signal line 151 in the second direction DR2 may be less than the width 131W of the first lower gate signal line 131 in the second direction DR2 in the overlapping area OA, and an entirety of the first upper gate signal line 151 may overlap a part of the first lower gate signal line 131 in the overlapping area OA. Therefore, although tolerance in the process of forming the first upper gate signal line 151 on the first lower gate signal line 131 is considered, a capacitance between the first lower gate signal line 131 and the first connection pattern 162 and a capacitance between the first upper gate signal line 151 and the first connection pattern 162 may be constantly maintained.

In an embodiment, a value subtracting the width 151W of the first upper gate signal line 151 in the second direction DR2 from the width 131W of the first lower gate signal line 131 in the second direction DR2 in the overlapping area OA may be greater than about 1 $\mu$m. In other words, the difference between the width 131W of the first lower gate signal line 131 in the second direction DR2 in the overlapping area OA and the width 151W of the first upper gate signal line 151 in the second direction DR2 may be greater than about 1 μm. A tolerance less than about 0.5 μm in the second direction DR2 may occur in the process of forming the first upper gate signal line 151 on the first lower gate signal line 131. Since the value subtracting the width 151W of the first upper gate signal line 151 in the second direction DR2 from the width 131W of the first lower gate signal line 131 in the second direction DR2 may be greater than about 1 μm in the overlapping area OA, although the tolerance less than about 0.5 μm in the second direction DR2 may occur in the process of forming the first upper gate signal line 151 on the first lower gate signal line 131, an entirety of the first upper gate signal line 151 may overlap a part of the first lower gate signal line 131 in the overlapping area OA.

In an embodiment, each of a width of the first lower gate signal line 131 in the second direction DR2 and a width of the first upper gate signal line 151 in the second direction DR2 may be constant. For example, a width of the first lower gate signal line 131 in the second direction DR2 outside the overlapping area OA may be substantially equal to the width 131W of the first lower gate signal line 131 in the second direction DR2 inside the overlapping area OA, and a width of the first upper gate signal line 151 in the second direction DR2 outside the overlapping area OA may be substantially equal to the width 151W of the first upper gate signal line 151 in the second direction DR2 inside the overlapping area OA.

Figure 19:
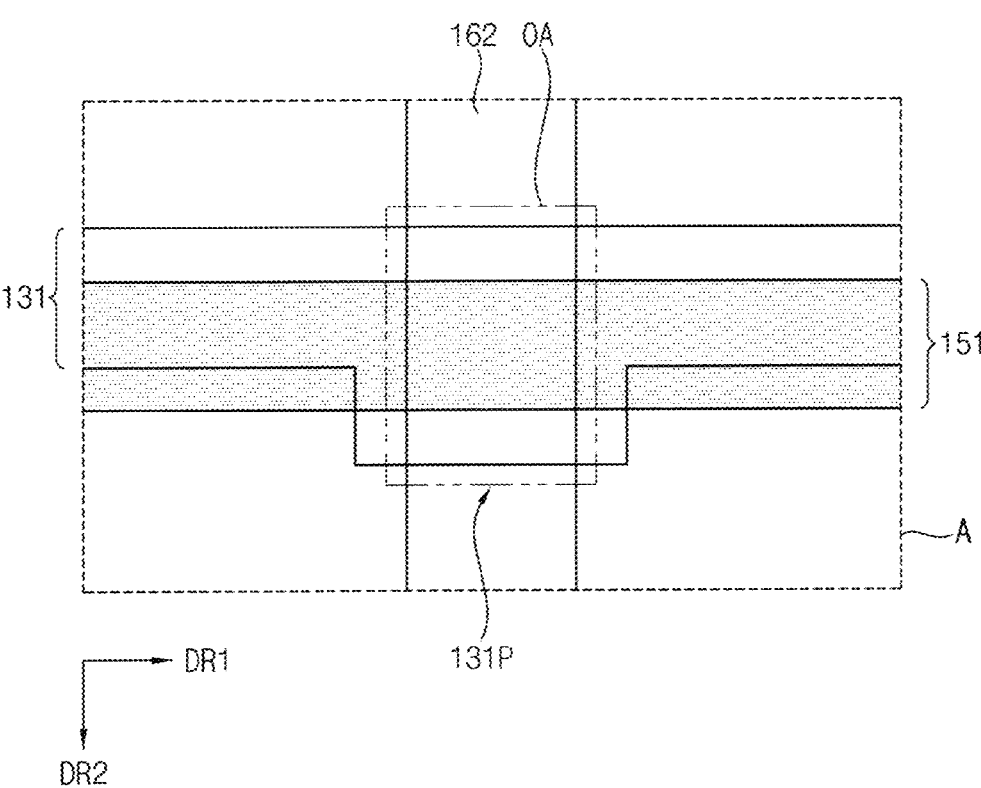
FIG. 19 is a layout diagram illustrating an example of an area A in FIG. 13.
Figure 20:
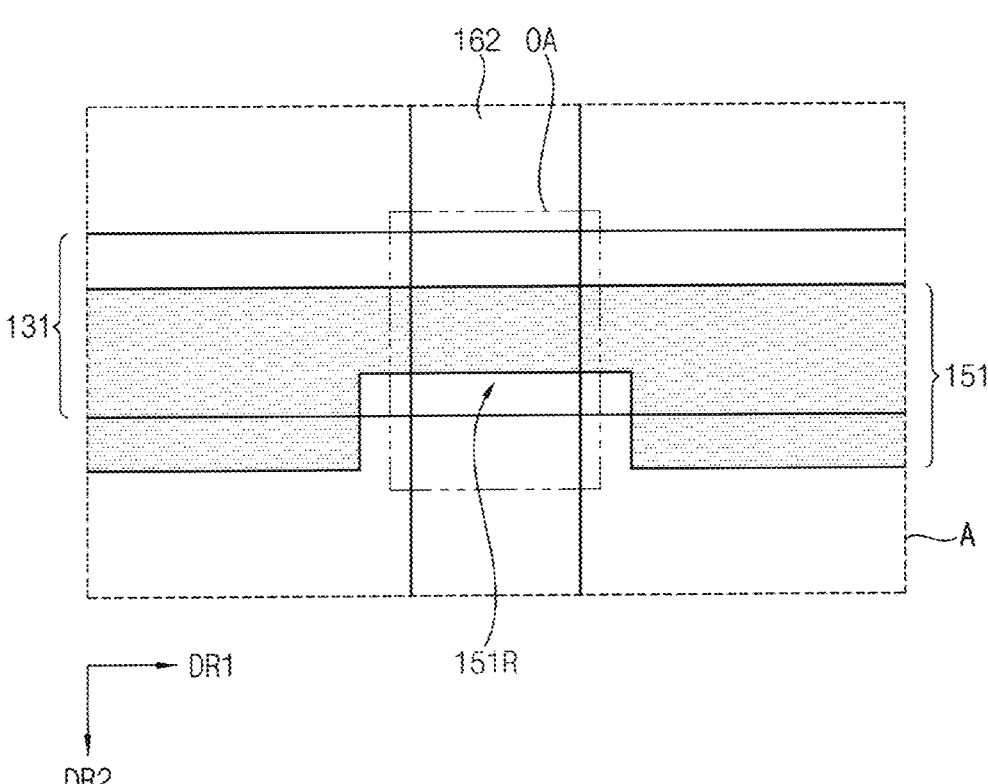
FIG. 20 is a layout diagram illustrating an example of an area A in FIG. 13.

FIG. 19 is a layout diagram illustrating an example of the area A in FIG. 13. FIG. 20 is a layout diagram illustrating an example of the area A in FIG. 13.

Referring to FIG. 19, in an embodiment, the first lower gate signal line 131 may protrude in the second direction DR2 in a plan view in the overlapping area OA. In such an embodiment, a portion of the first upper gate signal line 151 outside the overlapping area OA may not overlap the first lower gate signal line 131, and the first lower gate signal line 131 may have a protruding portion 131P protruding in the second direction DR2 in the overlapping area OA. For example, a width of the first lower gate signal line 131 in the second direction DR2 outside the overlapping area OA may be less than a width 131W of the first lower gate signal line 131 in the second direction DR2 inside the overlapping area OA, and a width of the first upper gate signal line 151 in the second direction DR2 outside the overlapping area OA may be substantially equal to a width 151W of the first upper gate signal line 151 in the second direction DR2 inside the overlapping area OA.

Referring to FIG. 20, in an embodiment, the first upper gate signal line 151 may be recessed in the second direction DR2 in a plan view in the overlapping area OA. In such an embodiment, a portion of the first upper gate signal line 151 outside the overlapping area OA may not overlap the first lower gate signal line 131, and the first upper gate signal line 151 may have a recessed portion 151R recessed in the second direction DR2 in the overlapping area OA. For example, a width of the first lower gate signal line 131 in the second direction DR2 outside the overlapping area OA may be substantially equal to a width 131W of the first lower gate signal line 131 in the second direction DR2 inside the overlapping area OA, and a width of the first upper gate signal line 151 in the second direction DR2 outside the overlapping area OA may be greater than a width 151W of the first upper gate signal line 151 in the second direction DR2 inside the overlapping area OA.

Figure 21:
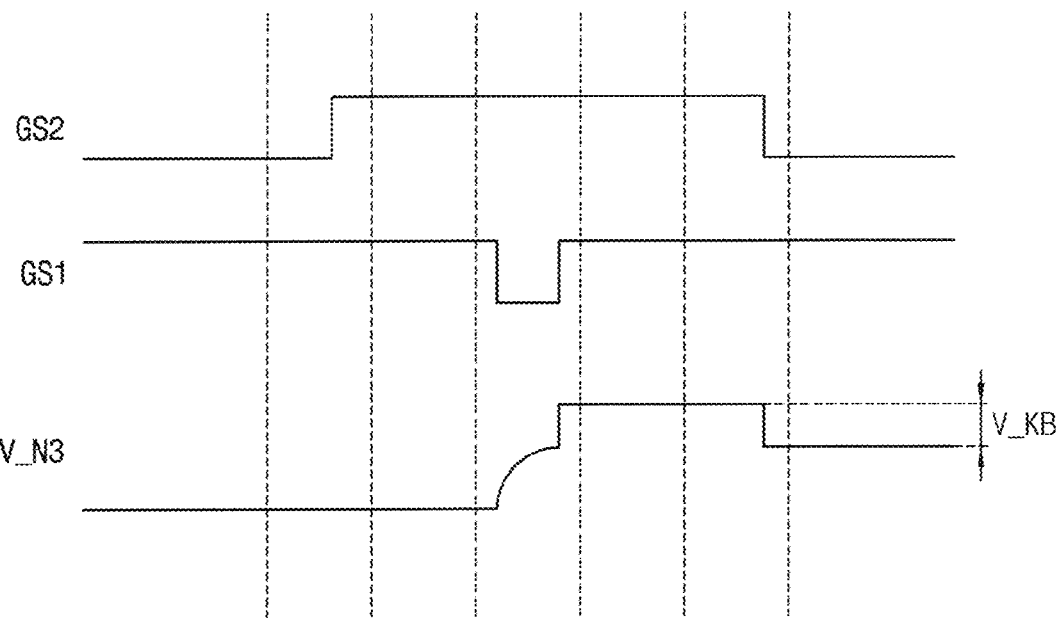
FIG. 21 is a diagram illustrating a kickback voltage of a third node based on a second gate signal.

FIG. 21 is a diagram illustrating a kickback voltage of the third node N3 based on the second gate signal GS2.

Referring to FIGS. 2, 18, and 21, in a case that the second gate signal GS2 applied to the gate electrode of the third transistor T3 is changed from a low level to a high level, the second node N2 and the third node N3 may be electrically connected to each other such that the first transistor T1 may be diode-connected. Then, in a case that the second transistor T2 is turned-on based on the first gate signal GS1, the data voltage DV may be applied to the first node N1, therefore, a voltage V_N3 in which a threshold voltage of the first transistor T1 may be compensated from the data voltage DV may be applied to the third node N3. Then, in a case that the second gate signal GS2 is changed from the high level to the low level, the voltage V_N3 of the third node N3 may be increase or decrease as much as a kickback voltage V_KB.

Because capacitances may be formed between the first lower gate signal line 131 and the first connection pattern 162 and between the first upper gate signal line 151 and the first connection pattern 162 in the overlapping area OA, the first lower gate signal line 131 and the first upper gate signal line 151 may electrically affect the first connection pattern 162. In a case that the second gate signal GS2 which the first lower gate signal line 131 and the first upper gate signal line 151 transmit is changed from the high level to the lower level, the voltage V_N3 of the first connection pattern 162 that may be the third node N3 may increase or decrease as much as the kickback voltage V_KB.

In a comparative example, in a case that kickback voltages V_KB occurred in pixel rows may be different from each other, stains may occur in the display device. However, in an embodiment, because the capacitance between the first lower gate signal line 131 and the first connection pattern 162 and the capacitance between the first upper gate signal line 151 and the first connection pattern 162 may be constantly maintained, kickback voltages V_KB that occurred in pixel rows may be substantially equal to each other, therefore, stains may not occur in the display device, and display quality of the display device may be improved.

Hereinafter, descriptions of elements of a display device described with reference to FIGS. 22 to 25, which may be substantially the same as or similar to those of the display device described with reference to FIGS. 17 to 20, will not be repeated.

Figure 22:
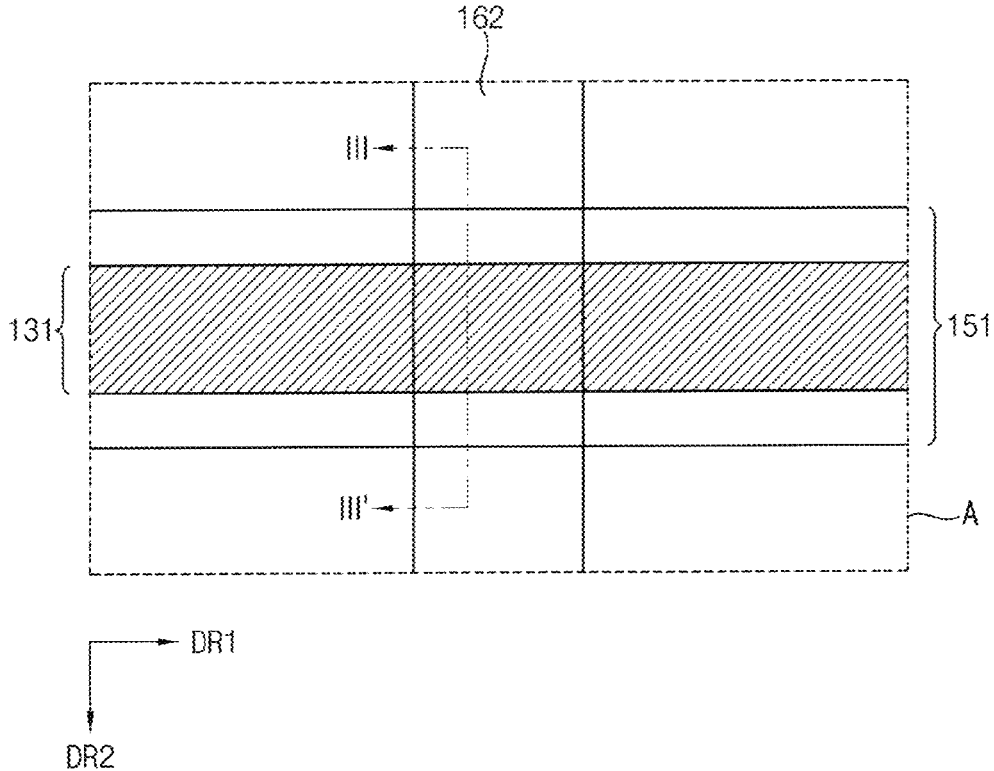
FIG. 22 is a layout diagram illustrating an example of an area A in FIG. 13.
Figure 23:
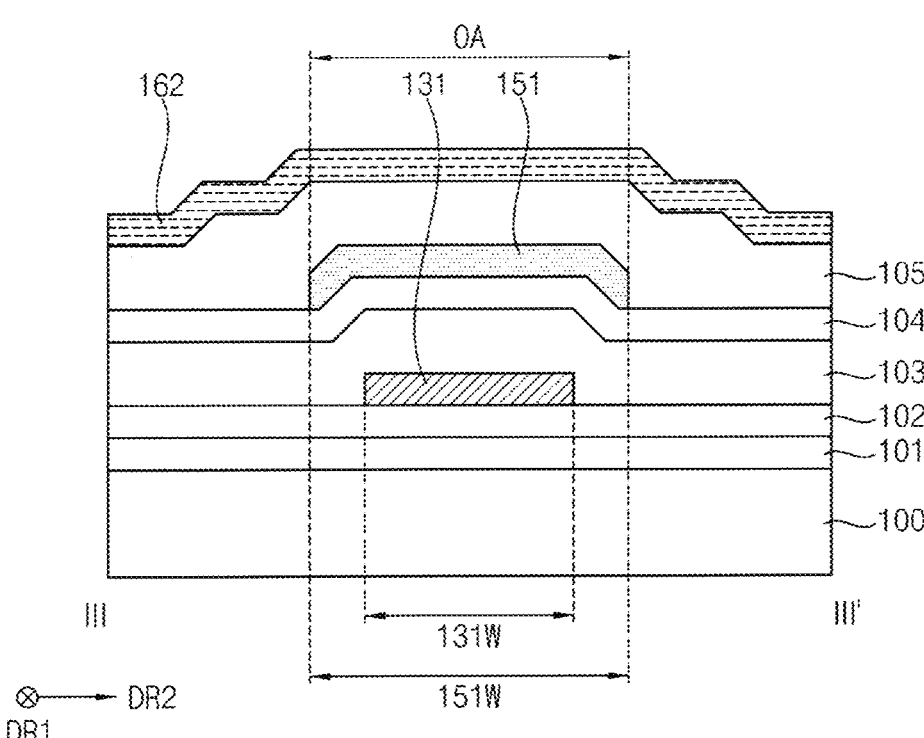
FIG. 23 is a schematic cross-sectional view taken along a line III-III' in FIG. 22.

FIG. 22 is a layout diagram illustrating an example of the area A in FIG. 13. FIG. 23 is a schematic cross-sectional view taken along a line III-III' in FIG. 22.

Referring to FIGS. 22 and 23, a width 151W of the first upper gate signal line 151 in the second direction DR2 may be greater than a width 131W of the first lower gate signal line 131 in the second direction DR2 in the overlapping area OA. An entirety of the first lower gate signal line 131 may overlap a part of the first upper gate signal line 151 in the overlapping area OA. In other words, a portion of the first upper gate signal line 151 may overlap the first lower gate signal line 131 in the overlapping area OA, and another portion of the first upper gate signal line 151 may not overlap the first lower gate signal line 131 in the overlapping area OA. For example, a central portion of the first upper gate signal line 151 in the second direction DR2 may overlap the first lower gate signal line 131 in the overlapping area OA, and side portions of the first upper gate signal line 151 in the second direction DR2 may not overlap the first lower gate signal line 131 in the overlapping area OA.

In an embodiment, the width 151W of the first upper gate signal line 151 in the second direction DR2 may be greater than the width 131W of the first lower gate signal line 131 in the second direction DR2 in the overlapping area OA, and an entirety of the first lower gate signal line 131 may overlap a part of the first upper gate signal line 151 in the overlapping area OA. Therefore, although tolerance in the process of forming the first upper gate signal line 151 on the first lower gate signal line 131 is considered, the first upper gate signal line 151 may shield the first lower gate signal line 131 from the first connection pattern 162. Accordingly, a capacitance between the first lower gate signal line 131 and the first connection pattern 162 and a capacitance between the first upper gate signal line 151 and the first connection pattern 162 may be constantly maintained.

In an embodiment, a value subtracting the width 131W of the first lower gate signal line 131 in the second direction DR2 from the width 151W of the first upper gate signal line 151 in the second direction DR2 in the overlapping area OA may be greater than about 1 μm. In other words, the difference between the width 151W of the first upper gate signal line 151 in the second direction DR2 in the overlapping area OA and the width 131W of the first lower gate signal line 131 in the second direction DR2 may be greater than about 1 μm. A tolerance less than about 0.5 μm in the second direction DR2 may occur in the process of forming the first upper gate signal line 151 on the first lower gate signal line 131. Since the value subtracting the width 131W of the first lower gate signal line 131 in the second direction DR2 from the width 151W of the first upper gate signal line 151 in the second direction DR2 is greater than about 1 μm in the overlapping area OA, although the tolerance less than about 0.5 μm in the second direction DR2 may occur in the process of forming the first upper gate signal line 151 on the first lower gate signal line 131, an entirety of the first lower gate signal line 131 may overlap a part of the first upper gate signal line 151 in the overlapping area OA.

In an embodiment, each of a width of the first lower gate signal line 131 in the second direction DR2 and a width of the first upper gate signal line 151 in the second direction DR2 may be constant. For example, a width of the first lower gate signal line 131 in the second direction DR2 outside the overlapping area OA may be substantially equal to the width 131W of the first lower gate signal line 131 in the second direction DR2 inside the overlapping area OA, and a width of the first upper gate signal line 151 in the second direction DR2 outside the overlapping area OA may be substantially equal to the width 151W of the first upper gate signal line 151 in the second direction DR2 inside the overlapping area OA. In other words, the widths of the first lower gate signal line 131 both inside and outside of the overlapping area OA in the second direction DR2 may be substantially equal. Similarly, the widths of the first upper gate signal line 151 both inside and outside of the overlapping area OA in the second direction DR2 may be substantially equal.

Figure 24:
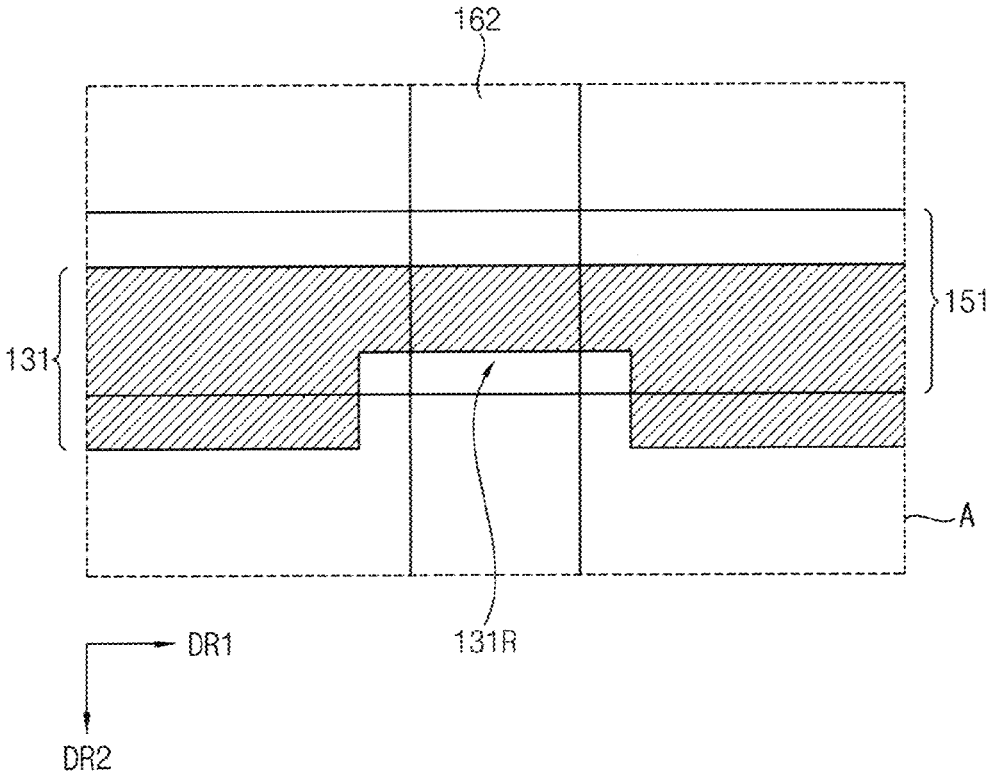
FIG. 24 is a layout diagram illustrating an example of an area A in FIG. 13.
Figure 25:
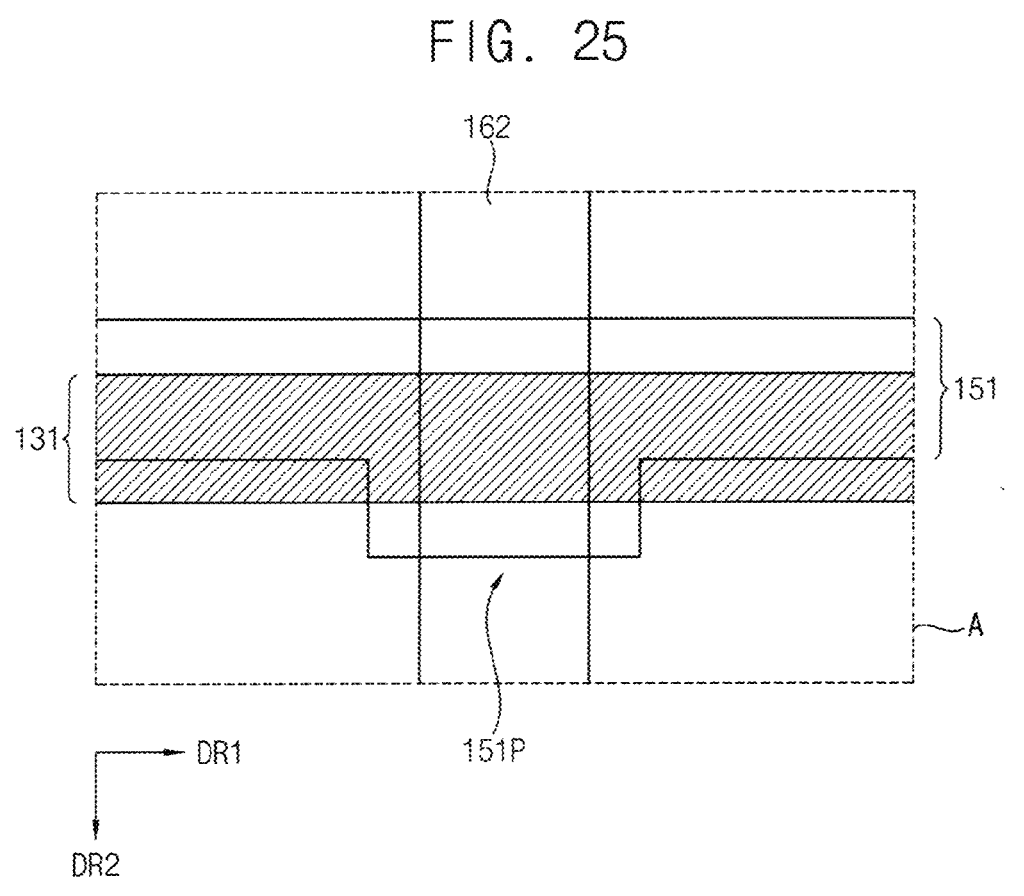

FIG. 24 is a layout diagram illustrating an example of the area A in FIG. 13. FIG. 25 is a layout diagram illustrating an example of the area A in FIG. 13.

Referring to FIG. 24, in an embodiment, the first lower gate signal line 131 may be recessed in the second direction DR2 in a plan view in the overlapping area OA. In such an embodiment, a portion of the first lower gate signal line 131 outside the overlapping area OA may not overlap the first upper gate signal line 151, and the first lower gate signal line 131 may have a recessed portion 131R recessed in the second direction DR2 in the overlapping area OA. For example, a width of the first lower gate signal line 131 in the second direction DR2 outside the overlapping area OA may be greater than a width 131W of the first lower gate signal line 131 in the second direction DR2 inside the overlapping area OA, and a width of the first upper gate signal line 151 in the second direction DR2 outside the overlapping area OA may be substantially equal to a width 151W of the first upper gate signal line 151 in the second direction DR2 inside the overlapping area OA.

Referring to FIG. 25, in an embodiment, the first upper gate signal line 151 may protrude in the second direction DR2 in a plan view in the overlapping area OA. In such an embodiment, a portion of the first lower gate signal line 131 outside the overlapping area OA may not overlap the first upper gate signal line 151, and the first upper gate signal line 151 may have a protruding portion 151P protruding in the second direction DR2 in the overlapping area OA. For example, a width of the first lower gate signal line 131 in the second direction DR2 outside the overlapping area OA may be substantially equal to a width 131W of the first lower gate signal line 131 in the second direction DR2 inside the overlapping area OA, and a width of the first upper gate signal line 151 in the second direction DR2 outside the overlapping area OA may be less than a width 151W of the first upper gate signal line 151 in the second direction DR2 inside the overlapping area OA.

Figure 26:
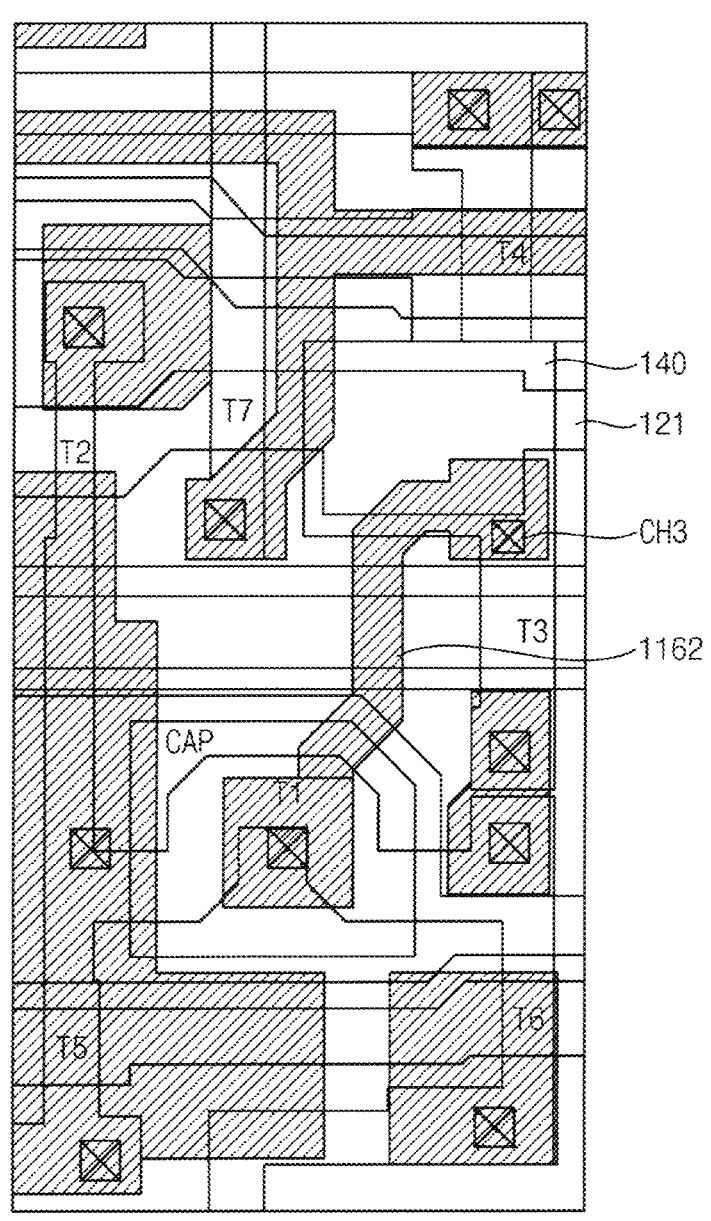
FIG. 26 is a layout diagram illustrating an example of the pixel in FIG. 2.
Figure 26:

FIG. 26 is a layout diagram illustrating an example of the pixel PX in FIG. 2. A pixel described with reference to FIG. 26 may be substantially the same as or similar to the pixel described with FIGS. 3 to 16 except for the structure of the first connection pattern 1162 and the position of the third contact hole CH3. Accordingly, descriptions on repeated elements will be omitted.

Referring to FIG. 26, in an embodiment, the third contact hole CH3 electrically connecting the second active layer 140 and the first connection pattern 1162 may not overlap the first gate signal line 121. In other words, the third contact hole CH3 and the first gate signal line 121 may be spaced apart from each other in a plan view. Accordingly, a path for compensating the threshold voltage of the first transistor T1 through the second active layer 140, the third contact hole CH3, and the first connection pattern 1162 may not overlap the first gate signal line 121 transmitting the first gate signal.

In a case that the third contact hole CH3 may overlap the first gate signal line 121, (in other words, in a case that the path for compensating the threshold voltage of the first transistor T1 may overlap the first gate signal line 121), a resistance of the second active layer 140 may increase due to the first gate signal which the first gate signal line 121 transmits, therefore, on-current of the third transistor T3 may decrease. However, in an embodiment, the third contact hole CH3 electrically connecting the second active layer 140 and the first connection pattern 1162 may not overlap the first gate signal line 121, so that the first gate signal which the first gate signal line 121 transmits may not substantially affect the path for compensating the threshold voltage of the first transistor T1. Accordingly, the decrease of the on-current of the third transistor T3 due to the increase of the resistance of the second active layer 140 may be prevented.

The display device according to embodiments may be applied to a display device included in a computer, a notebook, a mobile phone, a smartphone, a smart pad, a PMP, a PDA, an MP3 player, or the like within the spirit and the scope of the disclosure.

Although the display devices according to embodiments have been described with reference to the drawings, the illustrated embodiments are examples, and may be modified and changed without departing from the technical spirit described in the following claims.

What is claimed is:
1. A display device comprising:
a first transistor including:

a first active layer disposed on a substrate, the first active layer including a first channel; and a gate electrode disposed on the first active layer, the gate electrode overlapping the first channel;

an insulation layer disposed on the gate electrode;

a second transistor including:

a lower gate electrode disposed on the insulation layer;

a second active layer disposed on the lower gate electrode, the second active layer including a second channel overlapping the lower gate electrode, and a first end portion of the second active layer being electrically connected to an end portion of the first active layer; and an upper gate electrode disposed on the second active layer, the upper gate electrode overlapping the second channel;

a lower gate signal line extending in a first direction, a portion of the lower gate signal line forming the lower gate electrode;

an upper gate signal line disposed on the lower gate signal line and extending in the first direction, a portion of the upper gate signal line forming the upper gate electrode; and a first connection pattern disposed on the upper gate signal line and connecting the gate electrode and a second end portion of the second active layer, wherein the first connection pattern intersects the lower gate signal line and the upper gate signal line in a plan view, the lower gate signal line and the upper gate signal line extend and partially overlap each other, and the lower gate signal line entirely overlaps the upper gate signal line in an intersecting area in which the first connection pattern intersects the lower gate signal line or the upper gate signal line and an intermediate area adjacent to the intersecting area in the first direction.

2. The display device of claim 1, wherein a width of the lower gate signal line in the intersecting area is greater than a width of the lower gate signal line in a non-intersecting area in which the first connection pattern does not intersect the lower gate signal line and the upper gate signal line and which is spaced apart from the intersecting area by the intermediate area between the intersecting area and the non-intersecting area.

3. The display device of claim 2, wherein a width of the upper gate signal line in the intersecting area is substantially equal to a width of the upper gate signal line in the non-intersecting area.

4. The display device of claim 2, wherein the second active layer of the second transistor is in the non-intersecting area.

5. The display device of claim 1, wherein a width of the upper gate signal line in the intersecting area is less than a width of the upper gate signal line in a non-intersecting area in which the first connection pattern does not intersect the lower gate signal line and the upper gate signal line and which is spaced apart from the intersecting area by the intermediate area between the intersecting area and the non-intersecting area.

6. The display device of claim 5, wherein a width of the lower gate signal line in the intersecting area is substantially equal to a width of the lower gate signal line in the non-intersecting area.

7. The display device of claim 1, wherein the first connection pattern intersects the lower gate signal line and the upper gate signal line in a second direction intersecting the first direction.

8. The display device of claim 7, wherein a difference between a width of the upper gate signal line and a width of the lower gate signal line in the intersecting area is greater than about 1 μm.

9. The display device of claim 7, wherein the first connection pattern extends in the second direction.

10. A display device comprising:

a first transistor including:

a first active layer disposed on a substrate, the first active layer including a first channel; and a gate electrode disposed on the first active layer, the gate electrode overlapping the first channel;

an insulation layer disposed on the gate electrode;

a second transistor including:

a lower gate electrode disposed on the insulation layer;

a second active layer disposed on the lower gate electrode, the second active layer including a second channel overlapping the lower gate electrode, and a first end portion of the second active layer being electrically connected to an end portion of the first active layer; and an upper gate electrode disposed on the second active layer, the upper gate electrode overlapping the second channel;

a lower gate signal line extending in a first direction, a portion of the lower gate signal line forming the lower gate electrode;

an upper gate signal line disposed on the lower gate signal line and extending in the first direction, a portion of the upper gate signal line forming the upper gate electrode; and a first connection pattern disposed on the upper gate signal line and connecting the gate electrode and a second end portion of the second active layer, wherein the first connection pattern intersects the lower gate signal line and the upper gate signal line in a plan view, the upper gate signal line and the lower gate signal line extend and partially overlap each other, and the upper gate signal line entirely overlaps the lower gate signal line in an intersecting area in which the first connection pattern intersects the lower gate signal line or the upper gate signal line and an intermediate area adjacent to the intersecting area in the first direction.

11. The display device of claim 10, wherein a width of the lower gate signal line in the intersecting area is less than a width of the lower gate signal line in a non-intersecting area in which the first connection pattern does not intersect the lower gate signal line and the upper gate signal line and which is spaced apart from the intersecting area by the intermediate area between the intersecting area and the non-intersecting area.

12. The display device of claim 11, wherein a width of the upper gate signal line in the intersecting area is substantially equal to a width of the upper gate signal line in the non-intersecting area.

13. The display device of claim 11, wherein the second active layer of the second transistor is in the non-intersecting area.

14. The display device of claim 10, wherein a width of the upper gate signal line in the intersecting area is greater than a width of the upper gate signal line in a non-intersecting area in which the first connection pattern does not intersect the lower gate signal line and the upper gate signal line and which is spaced apart from the intersecting area by the intermediate area between the intersecting area and the non-intersecting area.

15. The display device of claim 14, wherein a width of the lower gate signal line in the intersecting area is substantially equal to a width of the lower gate signal line in the non-intersecting area.

16. The display device of claim 10, wherein the first connection pattern intersects the lower gate signal line and the upper gate signal line in a second direction intersecting the first direction.

17. The display device of claim 16, wherein a difference between a width of the lower gate signal line and a width of the upper gate signal line in the intersecting area is greater than about 1 μm.

18. The display device of claim 16, wherein the first connection pattern extends in the second direction.

19. A mobile phone comprising:

a display device comprising:

a first transistor including:

a first active layer disposed on a substrate, the first active layer including a first channel; and a gate electrode disposed on the first active layer, the gate electrode overlapping the first channel;

an insulation layer disposed on the gate electrode;

a second transistor including:

a lower gate electrode disposed on the insulation layer;

a second active layer disposed on the lower gate electrode, the second active layer including a second channel overlapping the lower gate electrode, and a first end portion of the second active layer being electrically connected to an end portion of the first active layer; and an upper gate electrode disposed on the second active layer, the upper gate electrode overlapping the second channel;

a lower gate signal line extending in a first direction, a portion of the lower gate signal line forming the lower gate electrode;

an upper gate signal line disposed on the lower gate signal line and extending in the first direction, a portion of the upper gate signal line forming the upper gate electrode; and a first connection pattern disposed on the upper gate signal line and connecting the gate electrode and a second end portion of the second active layer, wherein the first connection pattern intersects the lower gate signal line and the upper gate signal line in a plan view, the lower gate signal line and the upper gate signal line extend and partially overlap each other, and the lower gate signal line entirely overlaps the upper gate signal line in an intersecting area in which the first connection pattern intersects the lower gate signal line or the upper gate signal line and an intermediate area adjacent to the intersecting area in the first direction.

20. The mobile phone of claim 19, wherein a width of the lower gate signal line in the intersecting area is greater than a width of the lower gate signal line in a non-intersecting area in which the first connection pattern does not intersect the lower gate signal line and the upper gate signal line and which is spaced apart from the intersecting area by the intermediate area between the intersecting area and the non-intersecting area.

21. The mobile phone of claim 20, wherein a width of the upper gate signal line in the intersecting area is substantially equal to a width of the upper gate signal line in the non-intersecting area.

22. The mobile phone of claim 20, wherein the second active layer of the second transistor is in the non-intersecting area.

23. The mobile phone of claim 19, wherein a width of the upper gate signal line in the intersecting area is less than a width of the upper gate signal line in a non-intersecting area in which the first connection pattern does not intersect the lower gate signal line and the upper gate signal line and which is spaced apart from the intersecting area by the intermediate area between the intersecting area and the non-intersecting area.

24. The mobile phone of claim 23, wherein a width of the lower gate signal line in the intersecting area is substantially equal to a width of the lower gate signal line in the non-intersecting area.

25. A mobile phone comprising:

a display device comprising:

a first transistor including:

a first active layer disposed on a substrate, the first active layer including a first channel; and a gate electrode disposed on the first active layer, the gate electrode overlapping the first channel;

an insulation layer disposed on the gate electrode;

a second transistor including:

a lower gate electrode disposed on the insulation layer;

a second active layer disposed on the lower gate electrode, the second active layer including a second channel overlapping the lower gate electrode, and a first end portion of the second active layer being electrically connected to an end portion of the first active layer; and an upper gate electrode disposed on the second active layer, the upper gate electrode overlapping the second channel;

a lower gate signal line extending in a first direction, a portion of the lower gate signal line forming the lower gate electrode;

an upper gate signal line disposed on the lower gate signal line and extending in the first direction, a portion of the upper gate signal line forming the upper gate electrode; and a first connection pattern disposed on the upper gate signal line and connecting the gate electrode and a second end portion of the second active layer, wherein the first connection pattern intersects the lower gate signal line and the upper gate signal line in a plan view, the upper gate signal line and the lower gate signal line extend and partially overlap each other, and the upper gate signal line entirely overlaps the lower gate signal line in an intersecting area in which the first connection pattern intersects the lower gate signal line or the upper gate signal line and an intermediate area adjacent to the intersecting area in the first direction.

26. The mobile phone of claim 25, wherein a width of the lower gate signal line in the intersecting area is less than a width of the lower gate signal line in a non-intersecting area in which the first connection pattern does not intersect the lower gate signal line and the upper gate signal line and which is spaced apart from the intersecting area by the intermediate area between the intersecting area and the non-intersecting area.

27. The mobile phone of claim 26, wherein a width of the upper gate signal line in the intersecting area is substantially equal to a width of the upper gate signal line in the non-intersecting area.

28. The mobile phone of claim 26, wherein the second active layer of the second transistor is in the non-intersecting area.

29. The mobile phone of claim 25, wherein a width of the upper gate signal line in the intersecting area is greater than a width of the upper gate signal line in a non-intersecting area in which the first connection pattern does not intersect the lower gate signal line and the upper gate signal line and which is spaced apart from the intersecting area by the intermediate area between the intersecting area and the non-intersecting area.

30. The mobile phone of claim 29, wherein a width of the lower gate signal line in the intersecting area is substantially equal to a width of the lower gate signal line in the non-intersecting area.

* * * * *